(12) United States Patent
Cameron et al.

(10) Patent No.: US 12,283,455 B2
(45) Date of Patent: Apr. 22, 2025

(54) MONOCHROMATOR DEVICE AND METHODS OF USE THEREOF

(71) Applicant: CORNELL UNIVERSITY, Ithaca, NY (US)

(72) Inventors: Duncan Cameron, Ithaca, NY (US); Jared Maxson, Ithaca, NY (US); David Muller, Ithaca, NY (US)

(73) Assignee: CORNELL UNIVERSITY, Ithaca, NY (US)

( * ) Notice: Subject to any disclaimer, the term of this patent is extended or adjusted under 35 U.S.C. 154(b) by 407 days.

(21) Appl. No.: 17/639,903

(22) PCT Filed: Sep. 3, 2020

(86) PCT No.: PCT/US2020/049152
§ 371 (c)(1),
(2) Date: Mar. 2, 2022

(87) PCT Pub. No.: WO2021/046187
PCT Pub. Date: Mar. 11, 2021

(65) Prior Publication Data
US 2022/0367141 A1 Nov. 17, 2022

Related U.S. Application Data

(60) Provisional application No. 62/976,150, filed on Feb. 13, 2020, provisional application No. 62/895,300, filed on Sep. 3, 2019.

(51) Int. Cl.
*H01J 37/26* (2006.01)
*H01J 37/141* (2006.01)
*H01J 37/147* (2006.01)

(52) U.S. Cl.
CPC .......... *H01J 37/147* (2013.01); *H01J 37/141* (2013.01); *H01J 37/26* (2013.01)

(58) Field of Classification Search
CPC ........ H01J 37/147; H01J 37/141; H01J 37/26; H01J 2237/047; H01J 37/265; H01J 2237/06333; H01J 37/05
(Continued)

(56) References Cited

U.S. PATENT DOCUMENTS 2,802,111 A  8/1957  Reisner
5,798,524 A  8/1998  Kundmann et al.
(Continued)

OTHER PUBLICATIONS

Duncan, C.J., et al., "Lossless Monochromation for Electron Microscopy with Pulsed Photoemission Sources and RF Cavities", Physical Review Applied 14(1). 014060 (2020).
Duncan, C.J., et al., "Improving Energy Resolution and Compensating Chromatic Aberration with a TM010 Microwave Cavity", N. Am. Particle Acc. Conf., Lansing, MI (2019).
(Continued)

*Primary Examiner* — Michael Maskell
(74) *Attorney, Agent, or Firm* — Troutman Pepper Locke LLP (Rochester)

(57) ABSTRACT

The present invention relates to a monochromator device. The monochromator device includes a first radiofrequency cavity positioned to receive an output beam from an electron source. A second radiofrequency cavity is positioned to receive the output beam from the first radiofrequency cavity. The first radiofrequency cavity and the second radiofrequency cavity are configured to, in combination, in combination, correct one or more energy deviations in time and space of the output beam.

25 Claims, 17 Drawing Sheets

(58) Field of Classification Search
USPC .................................. 250/306, 307, 310, 311
See application file for complete search history.

(56) References Cited

U.S. PATENT DOCUMENTS

| | | |
|---|---|---|
| 6,949,744 B2 | 9/2005 | Steigerwald et al. |
| 7,227,297 B2 | 6/2007 | Srinivasan-Rao et al. |
| 7,446,601 B2 | 11/2008 | Lechevalier |
| 8,787,529 B2 | 7/2014 | Graves et al. |
| 9,024,256 B2 | 5/2015 | Ruan et al. |
| 9,406,479 B1 | 8/2016 | Mankos |
| 9,984,852 B1 | 5/2018 | Luiten et al. |
| 10,032,599 B2 | 7/2018 | Kieft |
| 10,529,536 B2 | 1/2020 | Luiten |
| 10,607,807 B2 | 3/2020 | Ruan |
| 2018/0301315 A1 | 10/2018 | Mukai |
| 2019/0096627 A1* | 3/2019 | Ruan .................. H01J 37/263 |

OTHER PUBLICATIONS

Duncan, C.J., et al., "New Methods for Compensating and Correcting Chromatic and Spherical Aberration in Electron Microscopes" Poster, Center of Bright Beams Science and Technology Center (Sep. 2, 2019).

Ehberger, D., et al., "Electron Energy Analysis by Phase-Space Shaping with THz Field Cycles", Structural Dynamics 5(4):044303 (2018).

Verhoeven, W., et al., "Time-of-Flight Electron Energy Loss Spectroscopy by Longitudinal Phase Space Manipulation with Microwave Cavities", Structural Dynamics 5(5), 051101 (2018).

Williams, J., et al., "Active Control of Bright Electron Beams with RF Optics form Femtosecond Microscopy", Structural Dynamics 4(4), 044035 (2017).

International Search Report and Written Opinion for corresponding Application No. PCT/US2020/049152 (mailed Nov. 23, 2020).

\* cited by examiner

MONOCHROMATOR DEVICE AND METHODS OF USE THEREOF

This application is a national stage application under 35 U.S.C. § 371 of International Application No. PCT/US2020/049152, filed Sep. 3, 2020, which claims the priority benefit of U.S. Provisional Patent Application Ser. No. 62/895,300 filed Sep. 3, 2019, and U.S. Provisional Patent Application Ser. No. 62/976,150, filed Feb. 13, 2020, which are hereby incorporated by reference in their entirety.

GOVERNMENT FUNDING

This invention was made with Government support under Grant Numbers PHY-1549132 awarded by the U.S. National Science Foundation. The United States Government has certain rights in the invention.

FIELD

The present technology relates to a monochromator device. More specifically, the present technology relates to a monochromator device for use in electron transmission microscopes and methods of use thereof.

BACKGROUND

The electron-optical properties of time varying fields have long been of fundamental interest to electron microscopists and accelerator physics. Resonant radiofrequency (rf) cavities in particular have been used in time-resolved electron diffraction and microscopy. The range of applications include: compressing electron pulses in time to femtosecond scale and below, temporal magnification of ultrafast events, impulsive acceleration and deceleration of beams over short distances, chopping continuous beams into short-pulses, and the controlled introduction of time-of-arrival correlations for performing energy measurements.

Radiofrequency cavities are the workhorses of particle acceleration at primary energies about 1 MeV. However, efforts toward adopting rf technology in electron microscopy have historically struggled to achieve the required precision in the timing of electron bunches. Today, advances in broadband laser sources and photocathode materials have largely solved the problem of synchronizing electron pulses with rf phases.

Lower energy spread beams are advantageous in all electron microscopy, both static and time-resolved. The importance to electron energy loss spectroscopy (EELS) is clear in that monochromation of continuous wave (CW) cold field emission (CFE) sources to the single meV scale has enabled measurements of phonon spectra with atomic spectral resolution in the scanning transmission electron microscope (STEM). Ultrafast pulsed beams of equally narrow energy spread would make it possible to resolve the different contributions of coupled lattice, charge, and spin dynamics to the spectrum of quantum materials. In applications beyond spectroscopy, source energy spread limits the spatial resolution of electron microscopes. Chromatic aberration is the barrier to achieving atomic diameter probes at low primary energies of less than 5 keV, a commonplace regime for scanning electron microscopy and industrial meteorology methods such as time resolved cathodoluminescence. Finally, designs for damage-mitigating, pulsed multipass electron microscopes employ monochromation.

The challenge in producing low energy spread beams is that the best sources have intrinsic spreads of hundreds of meV. To date, monochromator designs that reach the single meV energy scale have relied on apertures in energy dispersive locations. Apertures cause a loss of beam current by a factor equal to the ratio between the desired energy spread and the source energy spread. A factor 100 reduction leaves little current for imaging in the continuous case, and prohibitively low current in the ultrafast case. Lossy monochromation at low voltages in infeasible because beam current must increase as accelerating voltage decreases to maintain a tolerable detector signal.

The present technology is directed to overcoming these and other deficiencies in the art.

SUMMARY

One aspect of the present technology relates to a monochromator device. The monochromator device includes a first radiofrequency cavity positioned to receive an output beam from an electron source. A second radiofrequency cavity is positioned to receive the output beam from the first radiofrequency cavity. The first radiofrequency cavity and the second radiofrequency cavity are configured to, in combination, correct one or more energy deviations in time and space of the output beam.

The present technology advantageously provides a monochromator device the includes at least two resonant radiofrequency cavities. Resonant radiofrequency cavities enable exquisite time-energy control of electron beams when synchronized with laser driven photoemission. The present technology provides a lossless monochromator design that exploits this fine control in the one-electron-per-pulse regime. The achievable maximum beam current on target is orders of magnitude greater than state-of-the-art monochromators for the same spatial and energy resolution. This improvement is the result of monochromating in the time domain, unconstrained by the transverse brightness of the electron source. The present technology may be employed in both ultra-fast and non-time-resolved microscopy.

DETAILED DESCRIPTION

The present technology relates to a monochromator device. More specifically, the present technology relates to a monochromator device for use in electron transmission microscopes and methods of use thereof.

One aspect of the present technology relates to a monochromator device. The monochromator device includes a first radiofrequency cavity positioned to receive an output beam from an electron source. A second radiofrequency cavity is positioned to receive the output beam from the first radiofrequency cavity. The first radiofrequency cavity and the second radiofrequency cavity are configured to, in combination, correct one or more energy deviations in time and space of the output beam.

Figure 1:
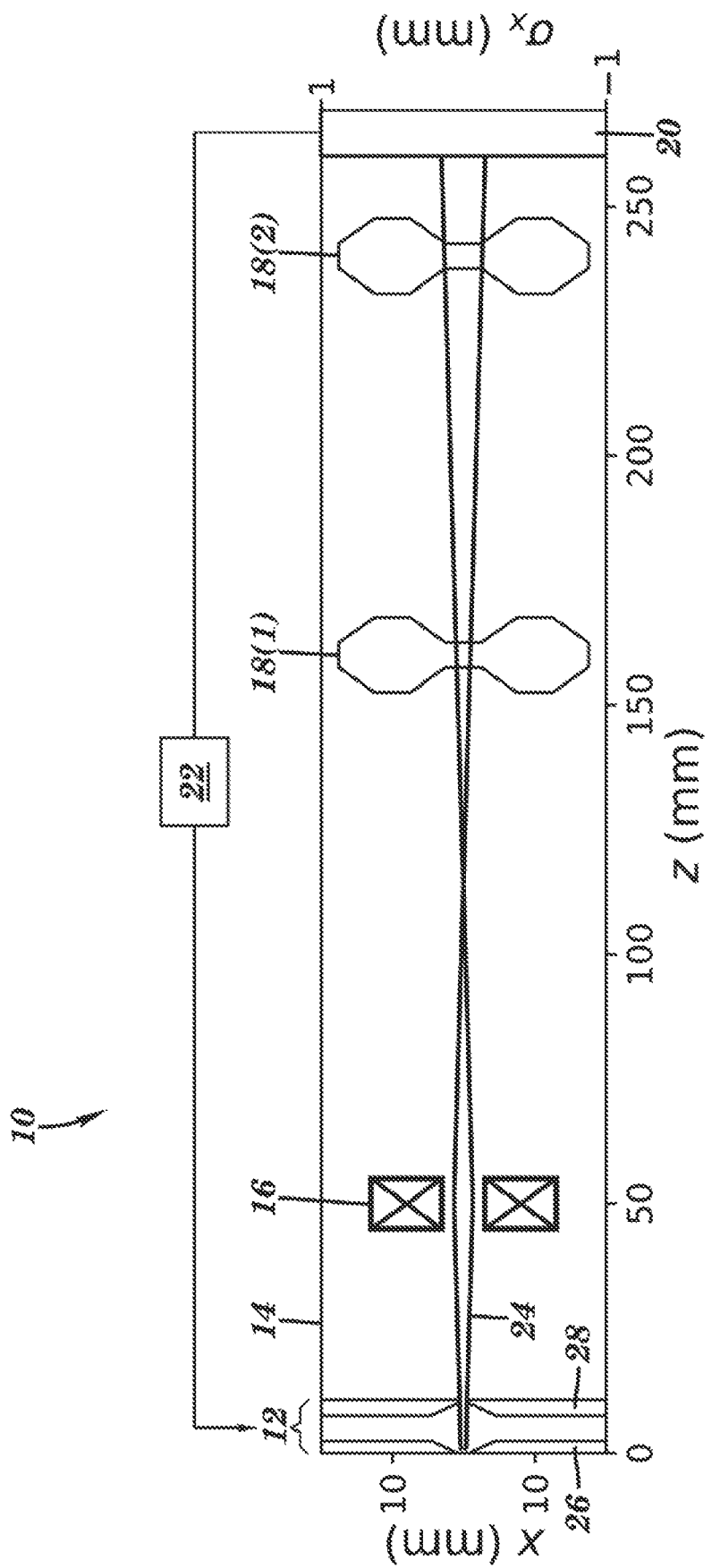
FIG. 1 is a schematic view of an exemplary configuration of a monochromator device in accordance with an embodiment of the present technology.

FIG. 1 is a schematic view of a first embodiment of monochromator device 10 of the present technology. Monochromator device 10 includes electron source 12, optical column 14, electromagnetic lens 16, first and second radiofrequency (rf) cavities 18(1) and 18(2), energy selector 20, and feedback circuit 22, although monochromator device 10 may include other types or numbers of elements or components, such as additional rf cavities, such as third and fourth rf cavities 18(3) and 18(4) illustrated in FIG. 2, as well as additional electromagnetic lenses by way of example only, in other configurations. In one example, rf cavities 18(1) and 18(2) can be incorporated into an existing ultra-fast electron transmission microscope (UEM) that photoemit from nanometer scale tips, where significant field enhancement occurs.

Monochromator device 10 provides a number of advantages over prior monochromator devices, including providing lossless energy spread reduction, which is possible because the time of arrival, and therefore rf accelerating phase, is tightly correlated with the energy of the particle from electron source 12. The advantages of monochromator device 10 are illustrated in comparison to prior art energy selector monochromator. Monochromator device 10 provides improved energy resolution without paying a cost in average current.

Figure 3B:
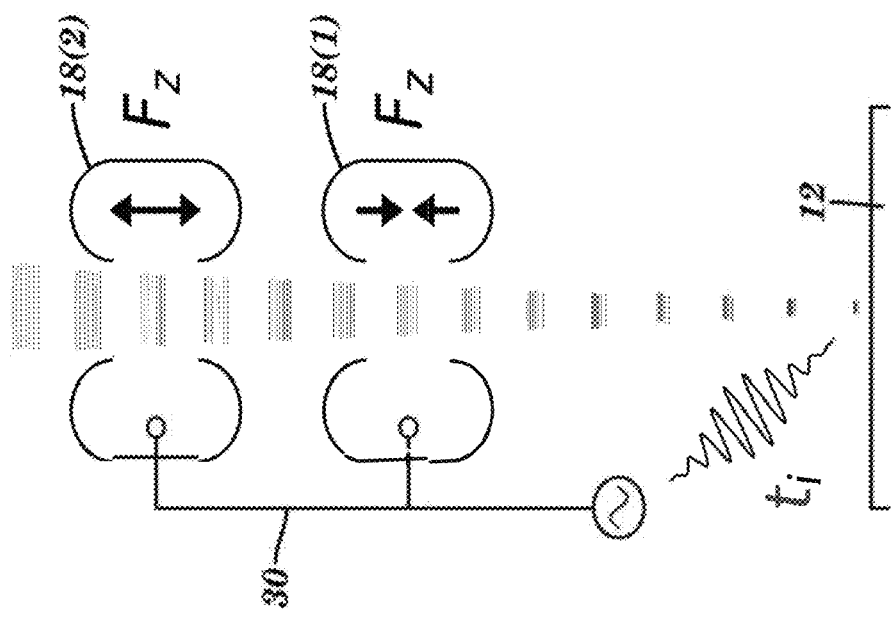
FIG. 3 is comparison between a prior art energy selecting monochromator (FIG. 3A) and the exemplary monochromator device of the present technology (FIG. 3B).
Figure 3A:
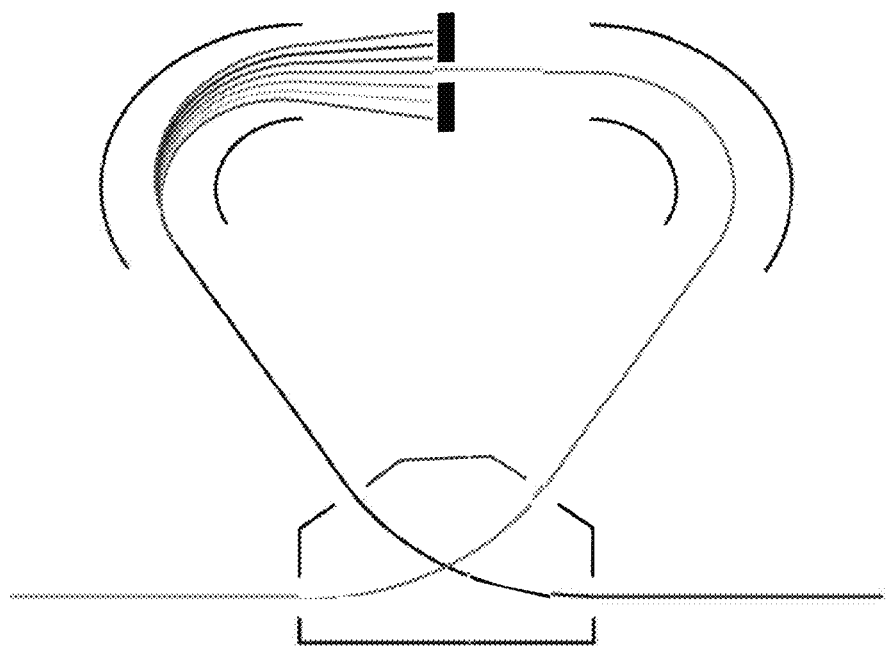

FIG. 3 is comparison between a prior art energy selecting monochromator (FIG. 3A) and exemplary monochromator device 10 of the present technology (FIG. 3B). FIG. 3A is a prior art energy selecting monochromator as described in O. L. Krivanek, et al., "High-energy-resolution monochromator for aberration-corrected scanning transmission electron microscopy/electron energy-loss spectroscopy." Philosophical Transactions of the Royal Society A: Mathematical, Physical and Engineering Sciences, 367, 3683-3697 (2009), in which magnetic prisms disperse the energy spectrum of the electron beam in the transverse direction and a narrow acceptance slit selects the desired bandwidth at the cost of lost current. As shown in FIG. 3B, for monochromator device 10, photoemission is triggered by a laser pulse from electron source 12 and the beam energy spectrum disperses in the longitudinal direction. Time-correlated acceleration in the first and second rf cavities 18(1) and 18(2), indicated by force vectors in the figure, equalizes the energies of the dispersed output beam 24. As described below, the average current for monochromator device 10 is limited by the frequencies of first and second rf cavities 18(1) and 18(2).

Monochromation entails a trade-off between final energy spread and average current on target, both in existing aperture-based energy-selectors and monochromator device 10. However, the constraints that impose the current-energy trade-off are different between the energy selector of FIG. 3A and monochromator device 10 as shown in FIG. 3B.

The conservation of longitudinal emittance in a pulsed beam relates the minimum energy spread achievable in lossless transport $\Delta E_{min}$ to the initial laser pulse length $t_l$ at the source, the final electron pulse length $t_f$, and the initial electron energy spread $\Delta K$:

$$\Delta E_{min} = \frac{t_l}{t_f} \Delta K \geq \frac{\hbar}{2t_f}. \quad (1)$$

The rightmost inequality is a consequence of the Heisenberg uncertainty principle, which sets the fundamental limit to longitudinal emittance. The factor $t_l$ includes the response time of the photocathode: on the scale of 10 fs for typical metallic photocathodes, and extending much longer (up to 100 fs and above) for semiconductor photocathodes. The single-electron-per pulse regime reaches the lowest possible emittances (both transverse and longitudinal) because of the absence of Coulomb interactions that would otherwise broaden energy distribution and spoil transverse coherence. In this regime, the maximum average current of a laser driven system synchronized to rf cavities is I$\alpha$v=fe, where e is the electron charge and f is the resonant frequency of the cavities. In time-resolved, pump-probe systems, the minimum practicable rf period is set by the time it takes the sample to relax to the ground state after pump excitation. Relaxation times vary significantly depending on the sample and the desired excitation strength. For non-time-resolved systems, the maximum repetition rate is equal to the cavity resonant frequency.

Pulses that stretch to fill the rf cycle acquire unwanted non-linear energy-time correlations, and thus these higher-order effects bound the allowable final pulse length. The duty cycle D denotes the ratio of final pulse length to rf period. Substituting the duty cycle into Equation (1) yields an expression for the maximum average current of the monochromator device 10:

$$I_{av} = \frac{De}{t_l} \frac{\Delta E_{min}}{\Delta K} = I_{pk} D \frac{\Delta E_{min}}{\Delta K}, \quad (2)$$

where $I_{pk}=e/t_l$ is the peak current at the cathode of electron source 12. Energy-selecting monochromators also show a linear scaling of average current with the fractional reduction in energy spread. The optimal performance of monochromator device 10, as described below, is thus equivalent to an energy-selector with an effective input current of $I_{pk}D$. An estimate of the allowable values of D depends on the configuration of monochromator device 10.

Referring again to FIG. 1, which illustrates the layout of monochromator device 10 the x-z plane, the left (x) axis is the transverse scale for the optical elements. The elements of monochromator device 10 including electron source 12, electromagnetic lens 16, and rf cavities 18(1) and 18(2) are axially symmetric.

Electron source 12 is configure to provide output beam 24. In this example, output beam 24 has an energy spread that is correlated with time and space to the first and second radiofrequency cavities 18(1) and 18(2). The transverse size of optical beam 24 is shown in FIG. 1 as it passes through monochromator device 10, with the scale indicated by the axis on the right. In one example, the electron source 12 is a high-energy resolution, pulsed electron source that provides an output beam 24 that has an energy between about 3 keV to about 300 keV. In one example, electron source 12 is an electron (DC) gun having cathode 26 and anode 28. In this example, cathode 26 and anode 28 are positioned at z=0, 10 mm, respectively.

Optical column 14 and electromagnetic lens 16 are configured to correlate the energy of output beam 24 with a time and position of arrival of output beam 24 at rf cavities 18(1) and 18(2). Stretching the electron pulse in time and space. An alternative method for stretching electron pulses is to insert a dedicated device comprising rf cavities and drift space, such as disclosed in B. Zeitler, et al., "Linearization of the longitudinal phase space without higher harmonic field," Physical Review Special Topics-Accelerators and Beams 18, 120102 (2015) and J. Franssen, et al. "Pulse length of ultracold electron bunches extracted from a laser cooled gas," Structural Dynamics 4, 044026 (2017), the disclosures of which are hereby incorporated by reference herein in their entirety. The omission of dedicated stretching cavities has the advantage of simplicity. Furthermore, by relying on the field of electron source 12 to stretch the pulse of output beam 24, monochromator device 10 does not require significant drift space for stretching to develop.

Figure 5:
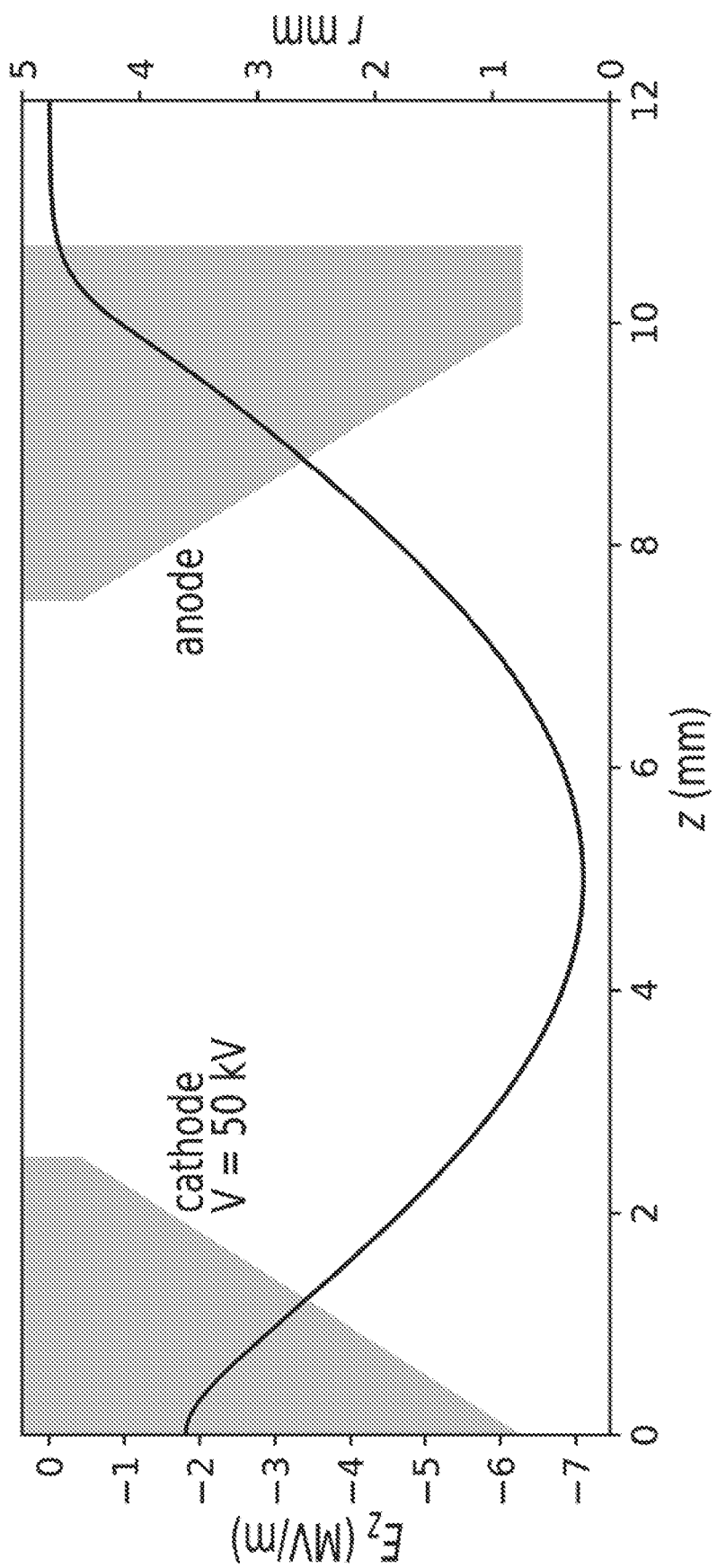
FIG. 5 is an exemplary electrode profile and axial field for the electron source for a voltage of 50 kV.
Figure 6:
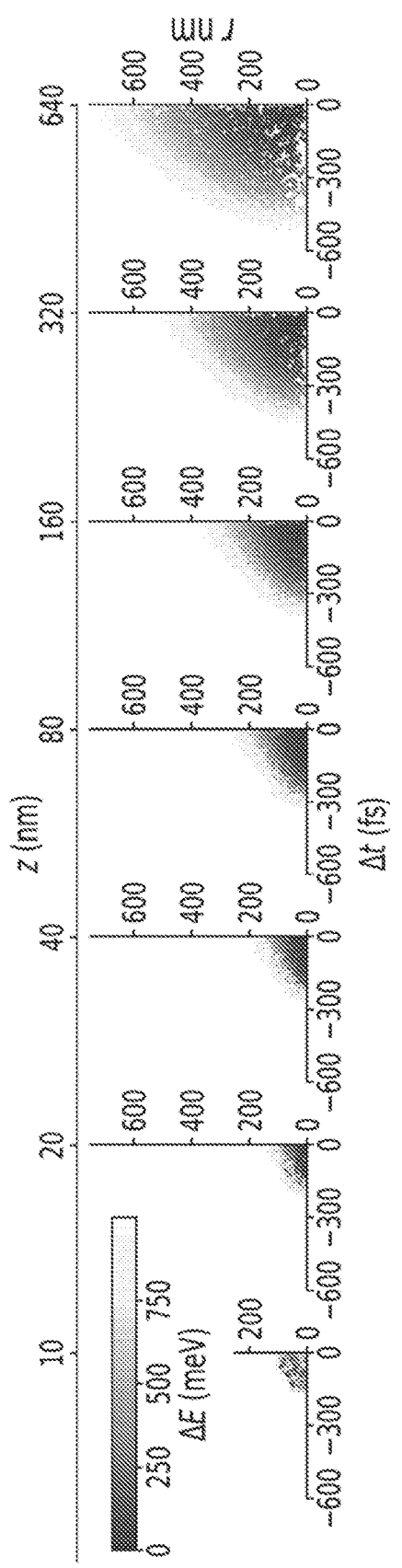
FIG. 6 illustrates the correlation between energy, radial position, and time of arrival for the electron source.

Correlations between energy, time and space naturally arises near zero energy in the low to moderate extraction fields (1-10 MV/m) of electron source 12, such as a de gun. FIG. 5 shows an exemplary electron source 12 field map and provides an electrode profile and axial field $E_z z$ in electron source for a voltage of 50 kf, for example. Illustrative snap-shots of the evolution of energy correlations in simulation are shown in FIG. 6.

An analytical model of stretching in an idealized electron source 12 field can be derived. Simply knowing the initial kinetic energy of a particle does not uniquely determine its time and position of arrival at first and second rf cavities 18(1) and 18(2). Instead, the inverse relationship is derived: the initial kinetic energy as a function of the time and position of arrival at first and second rf cavities 18(1) and 18(2). The exit of electron source 12 serves as the primary reference plane for particle coordinates. Any equipotential plane downstream of the anode would fulfil this role equally well. The analytic model described herein ignores fringing effects and thus takes anode 28 to be the exit of electron source 12. The initial kinetic energy is nonrelativistic and thus proportional to the sum of squares of initial momenta. The problem thus reduces to expressing each of the three initial momenta separately in terms of their conjugate coordinates at the gun exit.

The initial longitudinal momentum of a particle is derived as a function of time of arrival at the reference plane, the exit of electron source 12. For the analytic derivation, it is assumed that electron source 12 is a uniform field strength $E_z\hat{z}$. This assumption is relaxed later. The relativistic equations of motion for a charged particle in a uniform electric field $E_z\hat{z}$, solved for t(z), gives equation (3)

$$t(z) = t_0 + \frac{p_z 0}{eE_z} + \sqrt{\frac{z^2}{c^2} - \frac{2z\gamma_0 m_e}{eE_z} + \frac{p_{z0}^2}{(eE_z)^2}}, \quad (3)$$

where $t_0$ is the time of emission, $p_{z0}$ is the initial longitudinal momentum at cathode 26, and $\gamma_0$ is the initial relativistic energy factor at cathode 26. Three terms add in quadrature under the square root and are named for convenience. First, the ultra-relativistic time of flight z/c, which is the time it would take a phot to travel the distance to z. Next, the Newtonian time of flight $\sqrt{-2zm/eE_z}$ is the time it would take a non-relativistic particle of mass $m=\gamma_0 m_e$ to reach z, starting at rest. Finally, the stopping time $-p_{z0}/eE_z$ is the time it would take the accelerating gradient to stop a particle fired toward the cathode with initial momentum $p=-p_{z0}\hat{z}$.

In the regime of interest, i.e., particles with approximately 1 eV initial energies and greater than 1 keV final energies, the smallest term is the stopping time. If Ez=−1 MV/m, the stopping time of an electron with velocity $v_z/c=0.002$ is 3 ps, the ultra-relativistic time of flight across a cathode gap of 1 cm is 30 ps, and the corresponding Netwonian time of flight is 500 ps.

In order to estimate the error that arises from neglecting the stopping time, the square root appearing in Equation (3) can be expanded in powers of the small quantity as given in Equation (4).

$$\delta = \frac{p_{z0}^2}{e^2 E_z^2} \left( \frac{z^2}{c^2} - \frac{2z\gamma_0 m_e}{eE_z} \right)^{-1}, \tag{4}$$

which is proportional to the square of the stopping time. Then, for the example values cited above, the correction term first order in $\delta$ is approximately 10 as. The relevant scale to compare is the uncertainty in the time of emission of a single electron packet, $t_l$, equal to the laser pulse length and photemission response time, which are on the order of 10 fs. Thus, the stopping time can safely be neglected inside the square root. Under the assumption that all initial kinetic energies are of single eV scale or less, it is also safe to assume $\gamma_0=1$, and no remaining term inside the square root term of Equation (3) depends on initial conditions. Thus, the square root drops out from the different in arrival times $\Delta t$ between two particles, and $\Delta t$ becomes linearly proportional to the difference in their longitudinal momenta $\Delta p_{z0}$, as indicated by equation (5):

$$\Delta t = \frac{\Delta p_{z0}}{eE_z} + \Delta t_0, \tag{5}$$

with $\Delta t_0$ the difference in emission times (relative to the arrival time of the laser pulse).

The most convenient choice of reference particle is the particle with zero initial kinetic energy. The arrival time therefore gives us the $p_{z0}$ of all particles to within a precision set by $t_l$, which is 1% for the example values. By comparison, fluctuations in the accelerating gradient, typically at the $10^{-5}$ level or below, have a negligible effect on time of arrival.

The coefficient of proportionality appearing in Equation (5) is independent of z and thus the length of electron source 12. A dependence on the length of electron source 12 is absent because the relative time of arrival is frozen for z large enough that $\delta \ll 1$, per Equation (4). The freezing of time of arrival differences makes it possible to generalize Equation (5) to non-uniform accelerating fields by replacing Ez with the photocathode field. The resulting expression is accurate so long as (i) the photocathode field is approximately uniform over a distance such that $\delta \ll 1$ and (ii) the particle velocities are increasing functions of z for the remaining length of the gun.

As for the transverse coordinates, the solution to the equation of motion in x (without transverse focusing) is given by Equation (6), $$x = \frac{p_{x0}}{m_e} \tau + x_0, \tag{6}$$

with $\chi_0$ the coordinate of the particle at emission and $\tau$ the proper time that elapses between emission of the particle and its crossing the transverse plane at z. The coordinate y follows from cylindrical symmetry. Let $\tau^*(z)$ be the proper time to reach z of a the reference particle (initially at rest). Expanding $\tau$ in $p_{z0}$ around $\tau^*(z)$ yields Equation (7) and Equation (8), $$\tau = \tau_* + \frac{d\tau}{dp_{z0}} p_z 0 + O(p_{z0}^2) \tag{7}$$

$$= -\frac{m_e c}{eE_z} \mathcal{A}(\gamma_*) + \frac{p_z}{eE_z} + O(p_{z0}^2). \tag{8}$$

Here, the variable $\gamma^*(z)$ is the relativistic factor for the reference particle and, $$A(\gamma^*) := \ln(\gamma^*) + \ln(1+\beta^*), \tag{9}$$

with $\beta^*(z)$ c the velocity of the reference particle. Dividing Equation (6) by Equation (5) shows that A approximates the aspect ratio $x/c\Delta t$, hence the choice of notation.

To find the initial kinetic energy K as a function of a particle's position and time of arrival, previous expressions derived for momenta are squared as shown in Equation (10):'

$$K(t, x, y) = \frac{(eE_z)^2}{2m_e}\left[(\Delta t - t_0)^2 + \frac{(x-x_0)^2 + (y-y_0)^2}{c^2 \mathcal{A}^2}\right], \tag{10}$$

recalling that Equation (9) defines the aspect ratio A and that $E_z$ is the cathode field. To arrive at this result, it is approximated that $\tau = \tau^*$. Simulation results verifying Equation (10) are discussed below. The leading correction to Equation (10) comes from considering the linear order in the expansion of t shown in Equation (8), which contributes a cubic term to the right-hand-side of Equation (10), as shown in Equation (11), $$\frac{\partial^3 K}{\partial t \partial \tau^2} = \frac{2(eE_z)^3}{m_e^2 c^3 \mathcal{A}^3}. \tag{11}$$

The relative size of this cubic term is given by Equation (12), $$\frac{\partial^3 K}{\partial t \partial r^2} \Delta t \bigg/ \frac{\partial^2 K}{\partial r^2} = \frac{2\gamma_0 \beta_{z0}}{\ln(\gamma_*) + \ln(1+\beta_*)} \sim \frac{\beta_{z0}}{\beta_*}. \tag{12}$$

The initial longitudinal particle velocity, $\beta_{z0}$ is on the order $10^{-3}$ for electrons emitted with kinetic energies less than 1 eV. The final velocity $\beta^*$ is approximately 0.5 at an accelerating voltage of 50 kV. Thus, for pulse stretching factors approaching 1000 or more, cubic order correlations put a ceiling on the final energy spread achievable with monochromator device 10 at parts per thousand the initial energy spread.

Electronmagnetic lens 16 is located along the path of output beam 24 between electron source 12 and first and second rf cavities 18(1) and 18(2), although additional electromagnetic lenses may be included in other locations. In one example, electromagnetic lens 16 is a solenoid that focuses output beam 24 from electron source 12. In another example, electromagnetic lens 16 is a magnetostaic lens. In this example, as shown in FIG. 1, electromagnetic lens is located at z=50 mm, although electromagnetic lens may be positioned in other locations.

Figure 2:
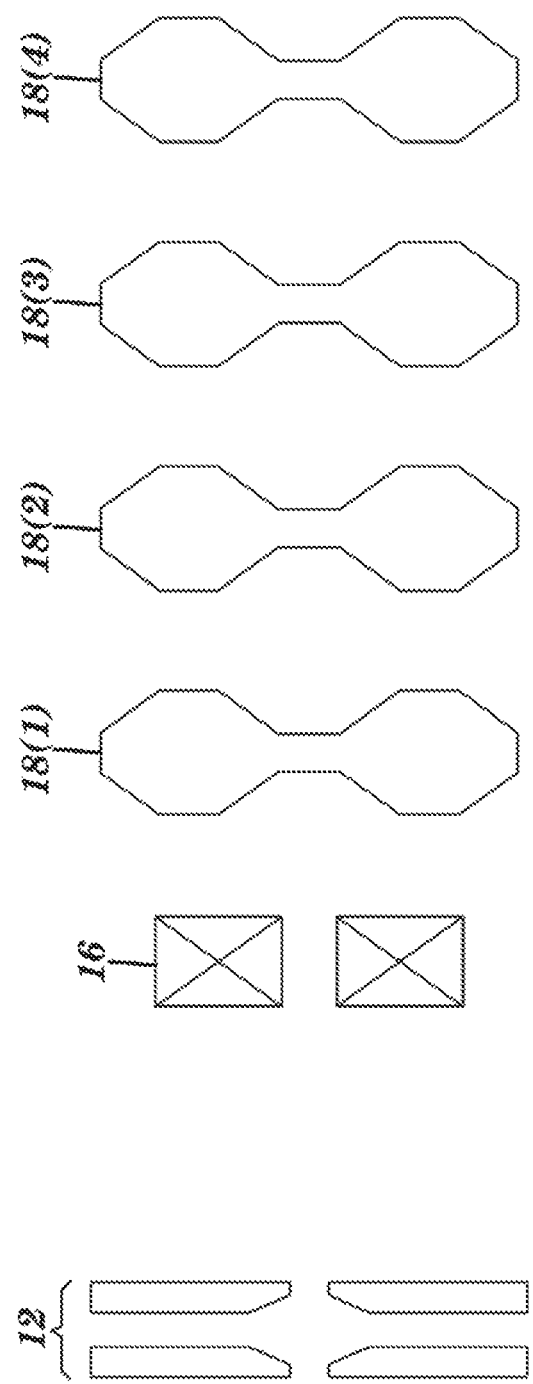
FIG. 2 is a schematic view another exemplary configuration of a monochromator device in accordance with another embodiment of the present technology.

First and second rf cavities 18(1) and 18(2) are configured, in combination, to correct one or more energy deviations in time and space for output beam 24 from electron source 12. In this example, first and second rf cavities 18(1) and 18(2) are located at z=160 mm and z=240 mm, respectively, although other locations may be employed. In other examples, as shown in FIG. 2, additional rf cavities 18(3) and 18(4) may be employed. The discussion of rf cavities 18(1) and 18(2) below also is applicable to rf cavities 18(3) and 18(4).

Referring again to FIG. 1, first rf cavity 18(1) is configured to correct a kinetic energy spread contained in a time degree of freedom for output beam 24, and second rf cavity 18(2) is configured to correct a kinetic energy spread in a transverse position degree of freedom for output beam 24. Each of first and second rf cavities 18(1) and 18(2) have a cavity resonant frequency and cavity length. In one example, first and second rf cavities 18(1) and 18(2) are at least substantially identical in at least one of resonant frequency cavity frequency or cavity length.

Figure 7:
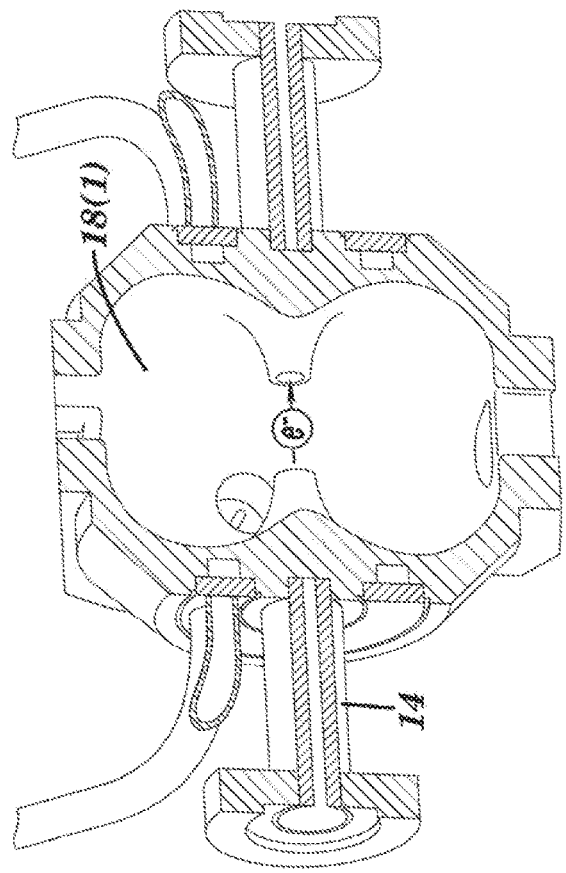
FIG. 7 is a cross-sectional view of an rf cavity of the exemplary monochromator device of the present technology.

First and second rf cavities 18(1) and 18(2) are positioned and configured to correct the kinetic energy spread contained in the time and transverse position degrees of freedom, respectively. In one example, first and second rf cavities 18(1) and 18(1) are identical in design, although in other examples first and second rf cavities 18(1) and 18(2) may have different designs. First and second rf cavities 18(1) and 18(2) may be similar to those described in P. Pasmans, et al., "Microwave TM(010) cavities as versatile 4D electron optical elements," Ultramicroscopy 127, 19 (2013), the disclosure of which is hereby incorporated by reference herein in its entirety. A perspective cross-sectional view of an exemplary rf cavity 18(1) is illustrated in FIG. 7. As described below, rf cavities 18(1) and 18(2) are configured to have phases and amplitudes that minimize the final energy spread of output beam 24. In one example, first and second rf cavities 18(1) and 18(2) are TM0101 cavities. FIG. 8 illustrates the electric field of the TM010 mode of first and second rf cavities 18(1) and 18(2) in monochromator device 10.

Parameters for first and second rf cavities 18(1) and 18(2) are chosen to minimize energy spread perform the additional function of undoing the appreciable effect of chromatic aberration in the upstream optics. In one example, the first and second rf cavities 18(1) and 18(2) provide more than two orders of magnitude reduction in beam energy spread, down to single digit meV, and may be employed in high-current, high-resolution electron beam applications at primary energies from single to hundreds of keV.

Figure 4:
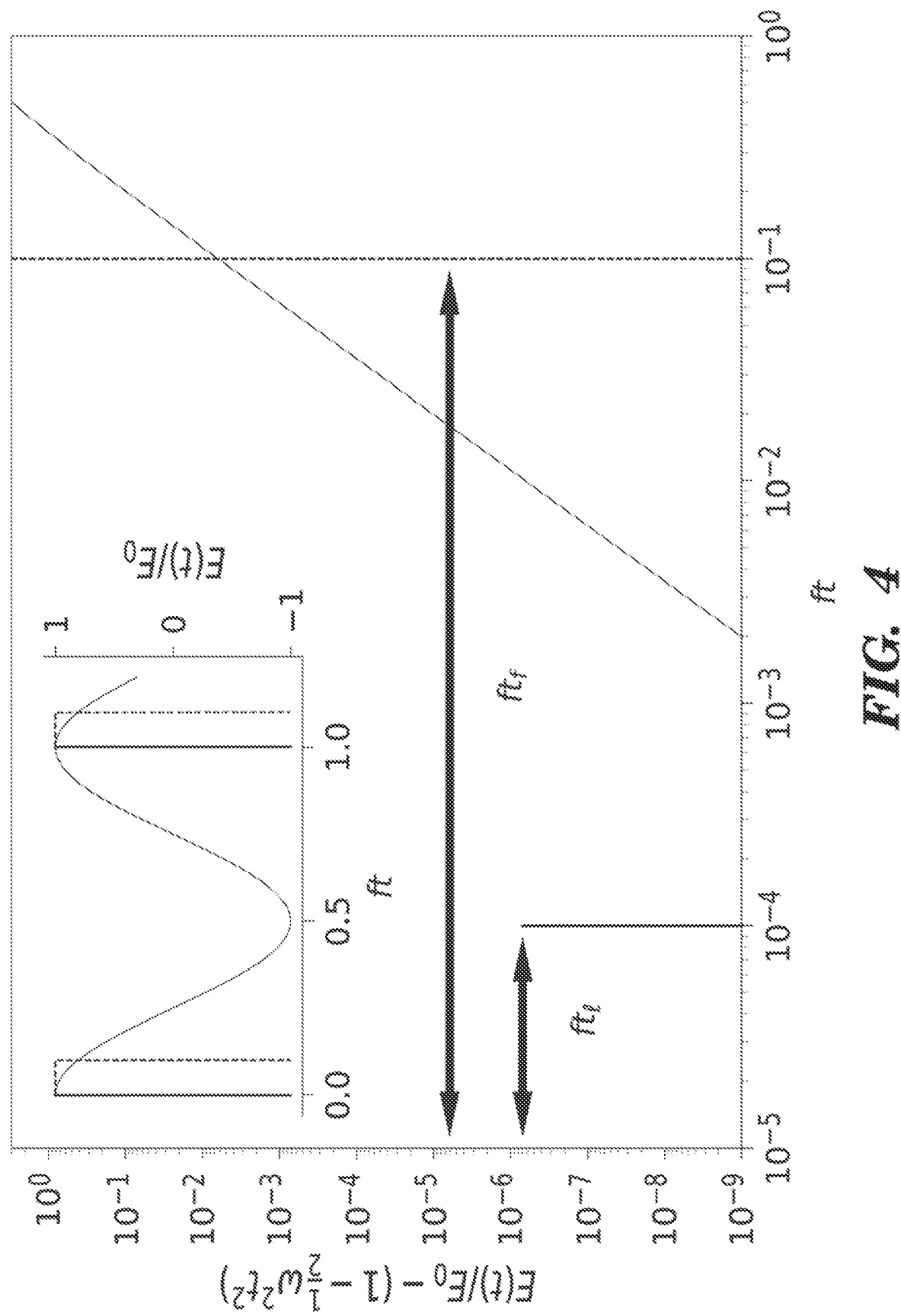
FIG. 4 is a plot of normalized energy gain versus single particle time of arrival, expressed as a fraction of the full rf period, for a single rf cavity.

Minimizing the final energy spread requires that the energy gain from the first and second rf cavities 18(1) and 18(2) depends quadratically on time. FIG. 4 is a plot of normalized energy gain versus single particle time of arrival, expressed as a fraction of the full rf period, for a single rf cavity. The quadratic coefficient of the energy gain is subtracted, leaving only unwanted higher order terms. The vertical lines show the initial pulse length $t_i$ (solid) and final pulse length $t_f$ (dashed). The duty cycle in Equation (2) is $ft_f$. The inset shows the full sinusoidal energy gain versus scaled time of arrival, with the quadratic term restored. FIG. 4 plots the cubic and higher order time dependence of the work done by a single rf cavity on a logarithmic scale.

Monochromator device 10 balances an orthogonal trade-off between temporal resolution and energy resolution, constrained by longitudinal brightness. Hence, holding the pulse length and energy spread at the sample constant, a reduction in the initial pulse length results in higher current on the target. To calculate the theoretical ceiling on the current that monochromator device 10 can deliver to an experimental target, an initial pulse length that approaches the quantum limit is supposed. Then, letting the duty-cycle be D=0.01 and the final energy spread 10 meV, the current on target is 20 nA, three orders of magnitude potential improvement.

Cathode 26 of electron source 12 makes the dominant contribution to energy spread, with the subleading contribution coming from fluctuations in the accelerating voltage. Monochromator device 10 specifically corrects source energy spread, relying on the correlation between initial kinetic energy and time and position of arrival. As discussed in further detail below, monochromator device 10 can incorporate fast feedback from existing beam diagnostic devices so as to compensate sub-leading sources of energy spread. Monochromator device 10 is advantageous compared to energy selectors for time resolved applications in that users can obtain improved energy resolution without paying a cost in average current.

The contribution that the transverse momenta make to total energy spread implies a parallel trade-off between transverse beam-size and energy-spread. Therefore, including the transverse contribution makes possible a reduction in energy spread without a compensating increase in pulse length. A natural mechanism to imagine realizing this possibility is a radial electric field that performs work to reduce the energy stored in the transverse momentum and, as a bi-product, collimates the beam. In one example, after expanding the beam, monochromator device 10 applies a spatially varying longitudinal field so as to balance an energy surplus in the transverse direction by creating an energy deficit in the longitudinal direction. Monochromator device 10 achieves its final energy spread by stretching the beam both transversely and longitudinally. The spatial and temporal trade-offs do not originate from two distinct constraints but are instead both consequences of the conservation of six-dimensional phase space volume.

Thus, if the expanded, reduced energy spread beam is again focused down to its source size or smaller by electromagnetic lens 16, then the pulse length stretches as the beam size shrinks. Electromagnetic lens 16 does no work and hence has no effect on energy spread, but produces pulse stretching due to variations in the path lengths traced by particles that are now travelling at much closer to the same velocity. In the applications of monochromator device 10, as set forth above, there is more experimental flexibility to trade longer pulses for lower energy spread than there is to vary beam size at the experimental target. Hence, Equation (1) formulated only in terms of the longitudinal variables captures the essential physics of monochromator device 10.

An exemplary operation of rf cavities 18(1) and 18(2) will now be described. Knowing the initial kinetic energy of a particle as a function of the coordinates Δt, x, y at the plane z, a matching expression can be derived for the work done by first and second rf cavities 18(1) and 18(2) on transiting particles. The following rigid beam approximation is used, which is exact in the limit that the cavity impulse is small compared to the mean particle momentum. Namely, it is assumed that particles transit with constant velocity, βc parallel to the symmetry axis. In this limit, only the longitudinal component of the cavity electric field contributes to the work done. FIG. 8 shows the electric field of the TMO10 mode supported by first and second rf cavities 18(1) and 18(2).

The longitudinal component of any axially symmetric transverse magnetic mode expands in powers of derivatives of the on axis longitudinal field $E_{o,z}$ is given as Equation (13), $$E_z(t, z, r) = J_0\left[r\sqrt{\frac{\partial^2}{\partial z^2} + \frac{\omega^2}{c^2}}\right]E_{0,z}(z)\cos(\omega t + \phi_0), \quad (13)$$

where $J_0$ is the zeroth order Bessel function, which for operator arguments is defined by the power series in Equation (14), $$J_0\left[\frac{\partial}{\partial z}\right] := \sum_{k=0}^{\infty}\left(\frac{-1}{4}\right)^k \frac{1}{(k!)^2}\frac{\partial^{2k}}{\partial z^{2k}}. \quad (14)$$

The free-parameter $\varphi_0$ is defined such that at $\varphi_0=0$ the reference particle undergoes the maximum change in energy. Integrating the right-hand-side of Equation (13) by parts to all orders in the derivative expansion gives the work W as a function of the radial coordinate $r=\sqrt{x^2+y^2}$ and the time of arrival t.

$$W(r, t) = -\int_{-\infty}^{\infty} eE \cdot ds \approx -\int_{-\infty}^{\infty} eE_z(t(z), z, r)dz \quad (15)$$

$$= -J_0\left(\frac{2\pi i}{\beta\gamma}\frac{r}{\lambda}\right)\cos(\phi)\int_{-\infty}^{\infty} eE_{0,z}(z)\cos\left(\frac{2\pi}{\beta}\frac{z}{\lambda}\right)dz, \quad (16)$$

with $\varphi=\omega\Delta t+\varphi_o$ and $\Delta t$ the difference in time of arrival at the exit of electron source 12, the same variable appearing in Equation (10). Referring the time of arrival to the exit of electron source 12 in this way is an approximation valid in the limit that drift sections between elements after anode 28 are short, which is the regime of interest. The integrand on the right-hand-side of Equation (16) is independent of r, t. Hence, neglecting the small spread in β, it is possible to define an effective cavity length $d_{RF}$ and voltage as described in P. Pasmans, et al., "Microwave TM(010) cavities as versatile 4D electron optical elements," Ultramicroscopy 127, 19 (2013), the disclosure of which is hereby incorporated by reference herein in its entirety. Letting $E_{max}$ be the maximum longitudinal field on axis yields Equation (17), $$d_{RF} := \frac{1}{E_{max}}\int_{-\infty}^{\infty} E_{0,z}(z)\cos\left(\frac{2\pi}{\beta_*}\frac{z}{\lambda}\right)dz. \quad (17)$$

Choosing $\varphi_0=0$ simplifies the conditions for canceling the quadratic dependence of energy on time appearing in Equation (10). With $\varphi_0=0$, the expression for W expands to quadratic order in r, t as, $$W(r, t) = -d_{RF}eE_{max}\left(1 - \frac{1}{2}\omega^2\Delta t^2 + \frac{\pi^2}{\beta^2\gamma^2}\frac{r^2}{\lambda^2}\right). \quad (18)$$

The term in r enters Equation (18) with the opposite sign to its counterpart in t because Equation (13) requires the peak of $E_{z,o}(z)$ to be a saddle-point in three dimensions.

By incorporating first and second rf cavities 18(1) and 18(2) in monochromator device 10, it is possible to make the cumulative energy gain a concave down quadratic function of both time and space. A negative quadratic dependence cancels the positive dependence imprinted at electron source 12. This strategy introduces the design problem of optimizing beam transport between rf cavities 18(1) and 18(2). It is conceptually simplest to suppose transfer optics that image the reference plane of the exit of electron source 12 successively at the mid planes of the two cavities. If the imaging condition is satisfied, the transfer map that relates the particle transverse coordinates at the exit of electron source 12 to the particle coordinate at a given cavity mid-plane is described by a single parameter, namely, the magnification factor M, x—Mx. $M_1$ and $M_2$ denote the magnification factors at each respective rf cavity 18(1) and 18(2), and $E_{max,1}$, $E_{max,2}$ the amplitudes for rf cavities 18(1) and 18(2). It follows from Equations (10) and (18) that the difference in energy ΔE between any particle and the reference particle, referred to the particle coordinates at the plane of the exit of electron source 12, splits into two terms:

$$\Delta E(t,r)=\Delta E(t)+\Delta E(r), \quad (19)$$

where, ignoring terms in t 0, x 0, y 0, as well as longitudinal drift for the present, $$\Delta E(t) = \left[\frac{(eE_z)^2}{2m_e} + d_{RF}e(E_{max,1} - E_{max,2})\frac{\omega^2}{2}\right]\Delta t^2 \quad (20)$$

$$\Delta E(r) = \left[\frac{(eE_z)^2}{2m_e e^2 \mathcal{A}^2} - \frac{\pi^2 d_{RF}e}{\beta_*^2\gamma_*^2\lambda^2}(E_{max,1}M_1^2 - E_{max,2}M_2^2)\right]r^2. \quad (21)$$

Again, $\beta^*$, $\gamma^*$ are the values for a particle initially at rest. To optimize rf cavities 18(1) and 18(2) for monochromation, ΔE(t), ΔE(r) are set to zero, yielding an under-constrained system of equations in the free variables $E_{max,1,2}$, $M_{1,2}$. That the system is under-constrained suggests the freedom to optimize a second design objective beyond energy spread. The most relevant second objective for microscopy applications is transverse emittance preservation Though under-constrained, Equation (20) does predict the net energy added to output beam 24 by monochromator device 10. The net energy added is a self-consistency test on the assumption that particle velocities remain approximately constant as they transit the cavities, which was made in deriving Equation (21). The total energy gain of output beam 24 is, $$-ed_{RF}(E_{max,1} - E_{max,2}) = \frac{1}{4\pi^2}\frac{(eE_z\lambda)^2}{m_e e^2}. \quad (22)$$

Given a 3 GHz cavity and an accelerating gradient of 1 MV/m, the total energy added is 500 eV. This energy scale indicates that rf amplitude noise at the $10^{-5}$ level or larger makes a non-negligible contribution to the final energy spread.

Equation (20) ignores the uncertainty in emission time $t_0$ set by the laser pulse length of electron source 12 and the photocathode response time $t_z$. Non-zero laser pulse length imposes another limit on the lowest achievable energy spread. If the laser pulse length is taken into account then at the earliest arrival times the final longitudinal distribution is linearly correlated between the emission time and energy.

The associated energy spread induced by non-zero emission time is given by Equation (23), $$\Delta E(t) = d_{RF} e (E_{max,1} - E_{max,2}) \omega^2 \frac{p_{z0}}{eE_z} t_0. \quad (23)$$

Substituting the expression for the net energy gain at the optimal cavity parameters in Equation (22) yields, $$\Delta E(t) = -\frac{eE_z}{m_e} p_{z0} t_0. \quad (24)$$

Equation (24) shows that the final energy spread is bounded by the longitudinal emittance at the source, i.e, by the product of the spread in initial longitudinal momentum and time of emission. For the residual spread $\Delta E(r)$ to be of the same size as or smaller than the residual $\Delta E(t)$, the source transverse size must be on the scale of single microns, provided beam sizes in the cavities of ~100 microns. Source sizes for the highest brightness microscopy applications, both pulsed and continuous wave, are on the nanometer scale. Thus, $\Delta E(r)$ can be neglected in estimating the final energy spread.

Energy selector 20 is positioned optically downstream from the second radiofrequency cavity, the energy selector comprising an opening having dimensions configured to pass all particles having a nominal accelerating voltage. Energy selector 20 is placed downstream of the first and second rf cavities 18(1) and 18(2) with a slit width chosen so that all particles are accepted at the nominal accelerating voltage. As the accelerating voltage changes, particles clipping the slit edge trigger the feedback mechanism to change electron source 12 high-voltage set-point.

Feedback circuit 22 is operatively connected to energy selector 20 and to electron source 12. Feedback circuit 22 is configured to adjust an output of electron source 12 responsive to particles failing to pass through the opening and instead impacting energy selector 20. In one example, feedback circuit 22 is configured to adjust a voltage set-point of electron source 12, such as an electron gun. In one example, monochromator device 10 includes feedback circuit 22, such as is included in the magnetic prism monochromator design as disclosed in O. L. Krivanek, "High-energy-resolution monochromator for aberration-corrected scanning transmission electron microscopy/electron energy-loss spectroscopy." Philosophical Transactions of the Royal Society A: Mathematical, Physical and Engineering Sciences, 367, 3683-3697 (2009), the disclosure of which is hereby incorporated herein by reference in its entirety.

In one example, feedback circuit 22 includes a feedback management computing device that includes one or more processor(s), a memory, and a communication interface that are coupled together by a bus or other communication link, although the feedback management computing device can include other types and/or numbers of elements in other configurations.

In this example, the processor(s) of the feedback management computing device may execute programmed instructions stored in the memory for any number of the functions or other operations illustrated and described by way of the examples herein, including receiving data from energy selector 20 and providing one or more instructions configured to adjust output beam 24 of electron source 12 in response to data from energy selector 20. The processor(s) of the feedback management computing device may include one or more CPUs, GPUs, or general processors with one or more processing cores, for example, although other types of processor(s) can be used.

The memory of the feedback management computing device stores the programmed instructions for one or more aspects of the present technology as illustrated and described herein, although some or all of the programmed instructions could be stored elsewhere. A variety of different types of memory storage devices, such as random access memory (RAM), read only memory (ROM), hard disk drive (HDD), solid state drives (SSD), flash memory, or other computer readable medium that is read from and written to by a magnetic, optical, or other reading and writing system that is coupled to the processor(s) can be used for the memory.

Accordingly, the memory of the feedback management computing device can store application(s) that can include executable instructions that, when executed by the feedback management computing device, cause the feedback management computing device to perform actions, such as generating one or more instructions to adjust output beam 24 of electron source 12 and providing the one or more instructions to adjust the operation of electron source as described by way of the examples herein. The application(s) can be implemented as modules or components of other application(s). Further, the application(s) can be implemented as operating system extensions, modules, plugins, or the like.

The communication interface of the feedback management computing device operatively couples and communicates between the feedback management computing device, energy selector 20, and electron source 12, which are all coupled together by one or more communication network(s), although other types and/or numbers of connections and/or configurations to other device and/or elements can be used. By way of example only, the communication network(s) can include local area network(s) (LAN(s)) or wide area network(s) (WAN(s)), and/or wireless networks, although other types and/or number of protocols and/or communication network(s) can be used.

Although the feedback management computing device is illustrated and described in the illustrative examples herein, other types and/or numbers of systems, devices, components, and/or elements in other topologies can be used. It is to be understood that the systems of the examples described herein are for exemplary purposes, as many variations of the specific hardware and software used to implement the examples are possible, as will be appreciated by those skilled in the relevant art(s). In some examples, the devices can be part of a rackmount system.

Portions of all of the examples of the technology illustrated and described herein may also be embodied as one or more non-transitory computer readable media having instructions stored thereon for one or more aspects of the present technology. The instructions in some examples include executable code that when executed by the processor of the feedback management computing device, cause the processor to carry out steps necessary to implement the methods of the examples of this technology that are illustrated and described herein.

EXAMPLES

The examples below are intended to exemplify the practice of embodiments of the disclosure but are by no means intended to limit the scope thereof.

Example 1—Simulation Results

Figure 10:
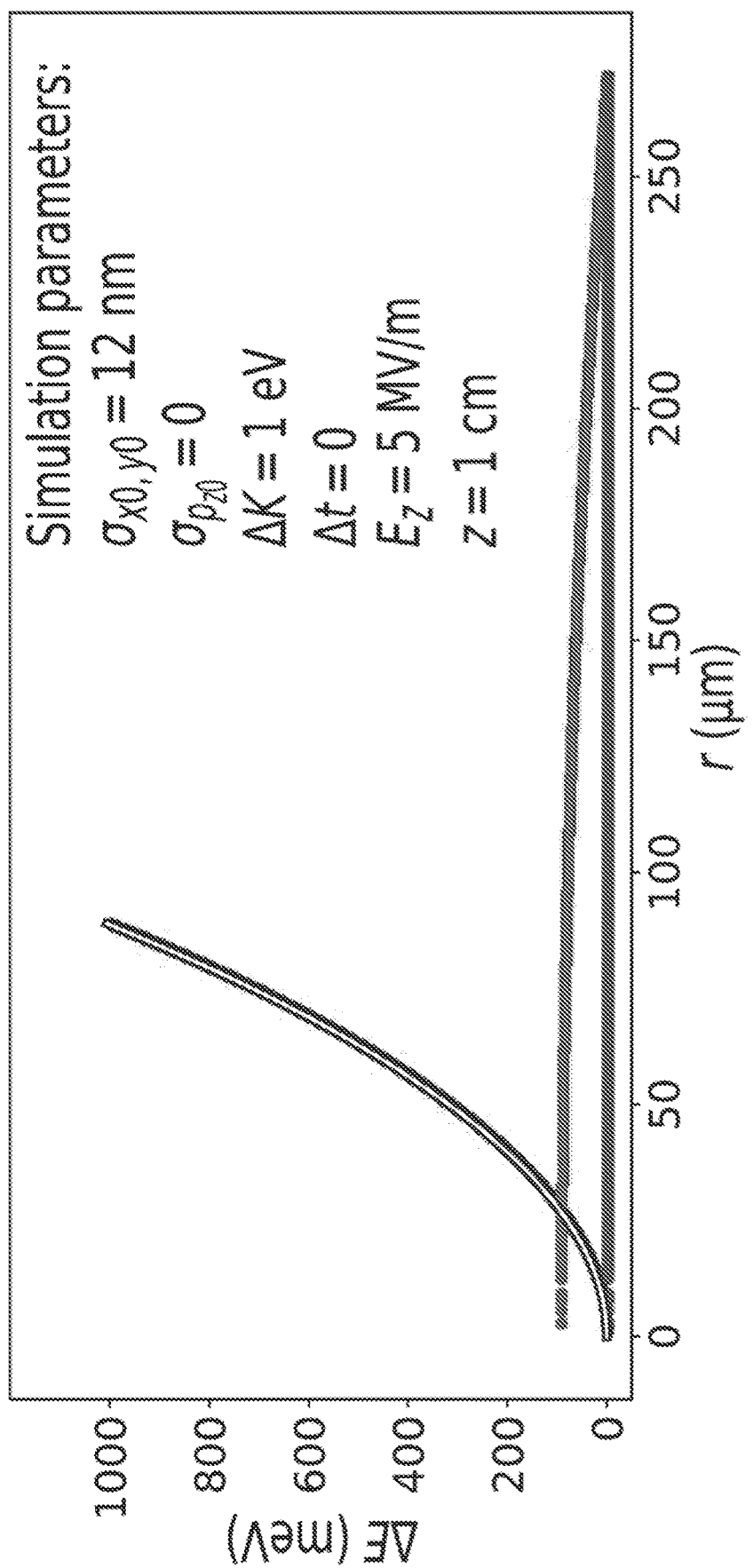
FIG. 10 is simulation of a beam with initial size $\sigma_x=12$ nm and nonzero transverse momentum spread. Here the beam has no longitudinal momentum spread and has zero duration. The upper curve shows the energy-space correlation just after the gun, and the lower curve shows the result after transiting a single cavity with amplitude set by Equation (21). The white line is the prediction of Equation (10). Due to thick lens effects, the cavity settings predicted by Equation (21) slightly over-correct the energy space correlation. The bottom curve is the result of numerical optimization of the cavity amplitude.
Figure 11A:
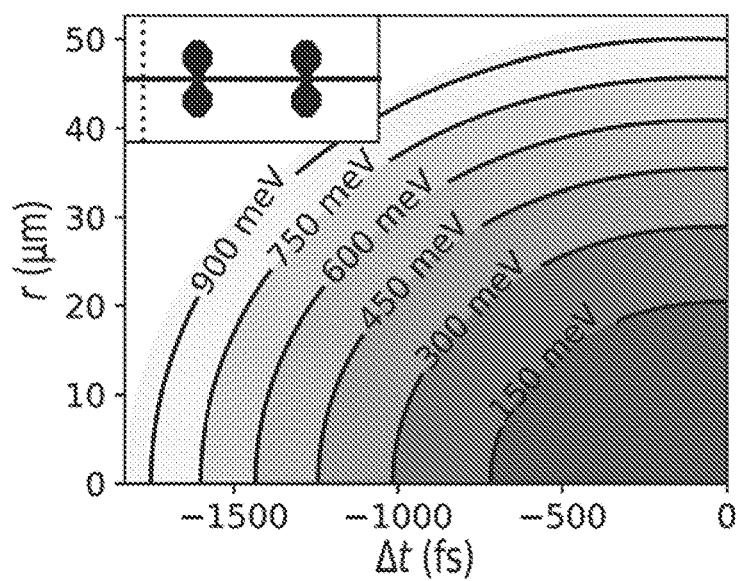
FIG. 11 is a simulated evolution of energy correlations on transiting the two RF cavities, with initial energy spread of 1 eV, vanishing initial transverse source size and vanishing initial pulse length: (a) post gun but before the first cavity, the paraboloid distribution predicted by Equation (10); (b) between the two cavities, the first cavity imparts a hyperboloid distribution as predicted by Equation (18), with energy increasing in time and space; (c) after the second cavity, the residual energy spread involves cubic corrections to Equation (10), shown in Equation (11).
Figure 11B:
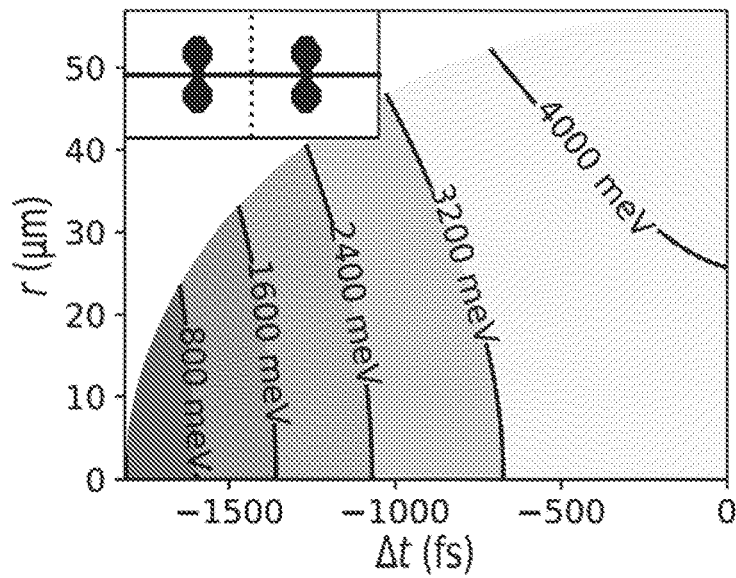
Figure 11C:
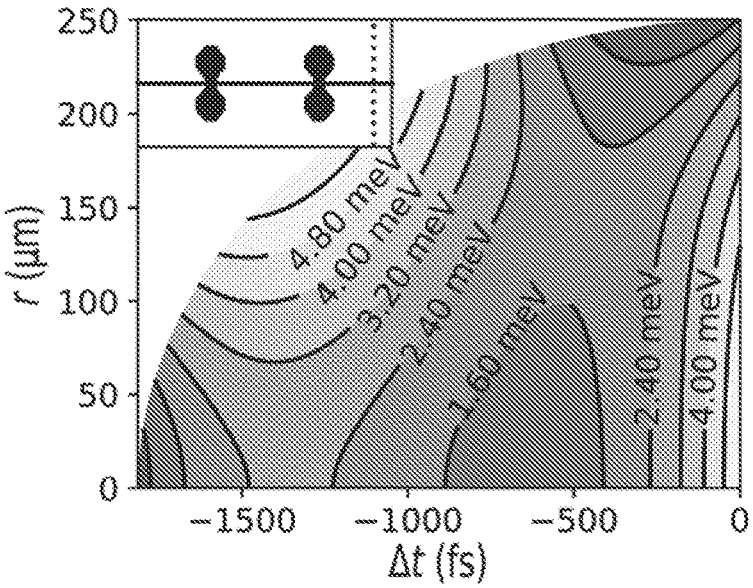
Figure 12:
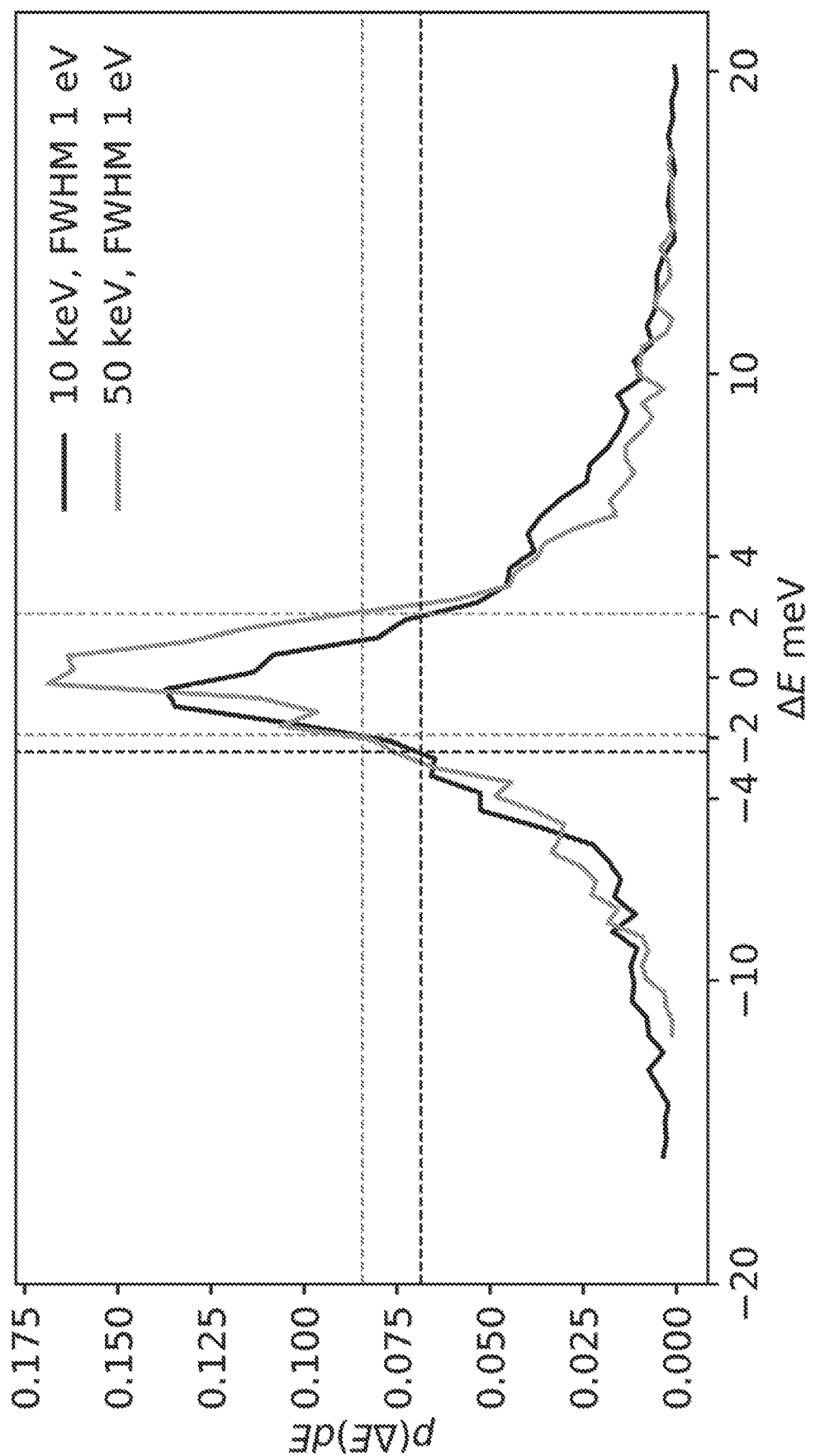
FIG. 12 is a graph of the results of simulating the beam-line shown in FIG. 10(a). Particle ensembles have initially uniform energy spread of 1 eV, distributed uniformly in solid angle over the forward hemisphere. Results for two accelerating voltages are shown for 10 kV and 50 kV.
Figure 13A:
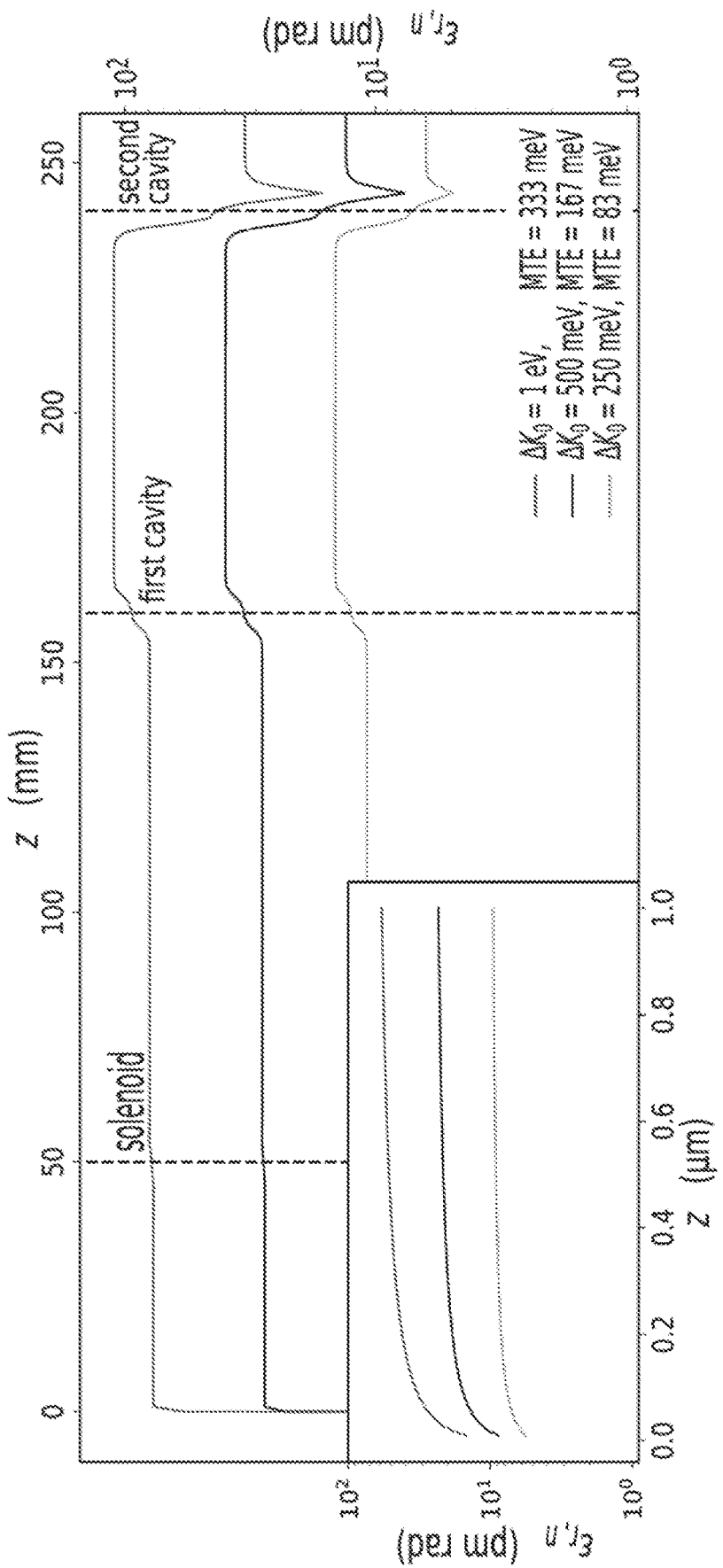
FIG. 13 is a graph of simulation results showing beam sizes and emittance as a function of beam-line position for three different initial energy spreads; all particle ensembles have initial transverse size of 12 nm R. M. S. and momenta distributed uniformly over the forward hemisphere; the initial uniform energy spread of 1 eV, 500 meV, 100 meV are illustrated. Cavity settings are chosen to achieve smallest final energy spread. (a) Transverse normalized emittance, (b) rms energy spread, (c) and (d) rms pulse duration.
Figure 13B:
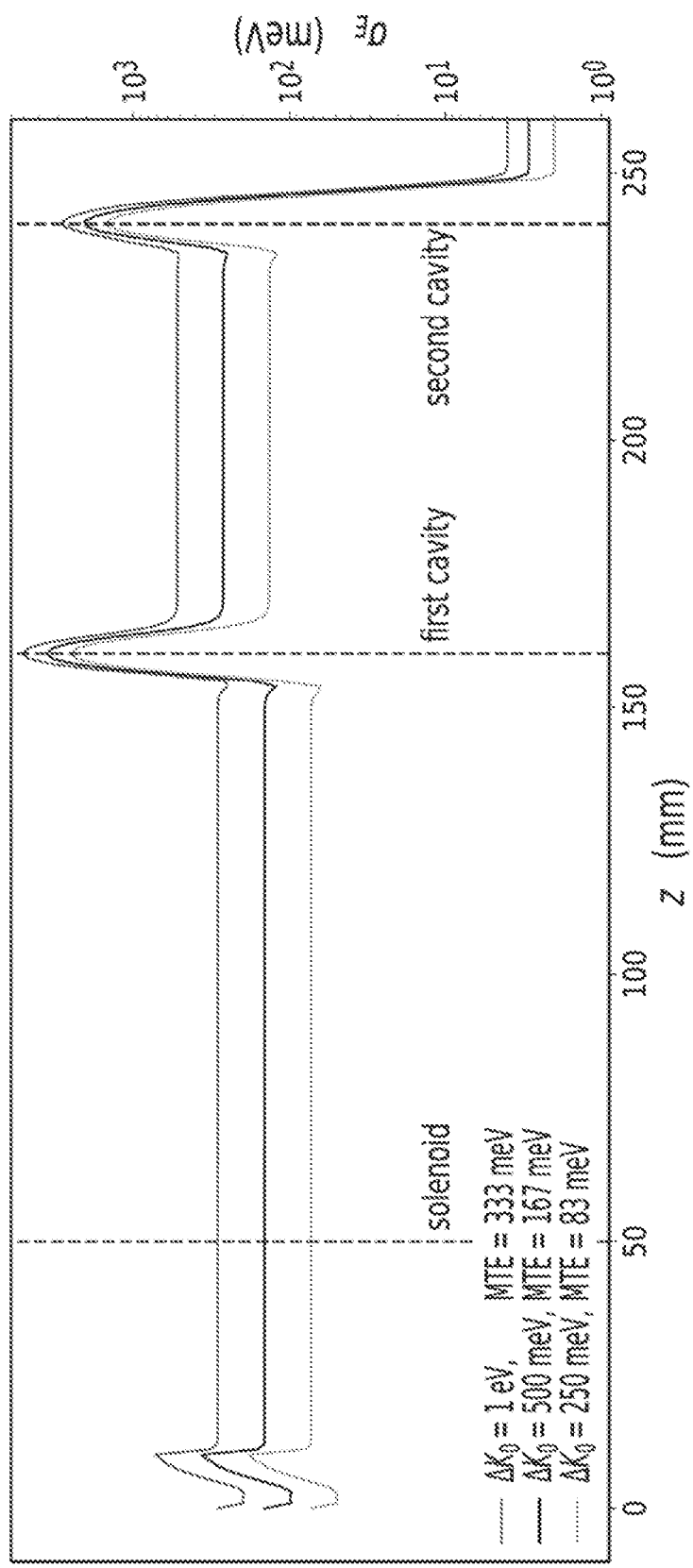
Figure 13D:
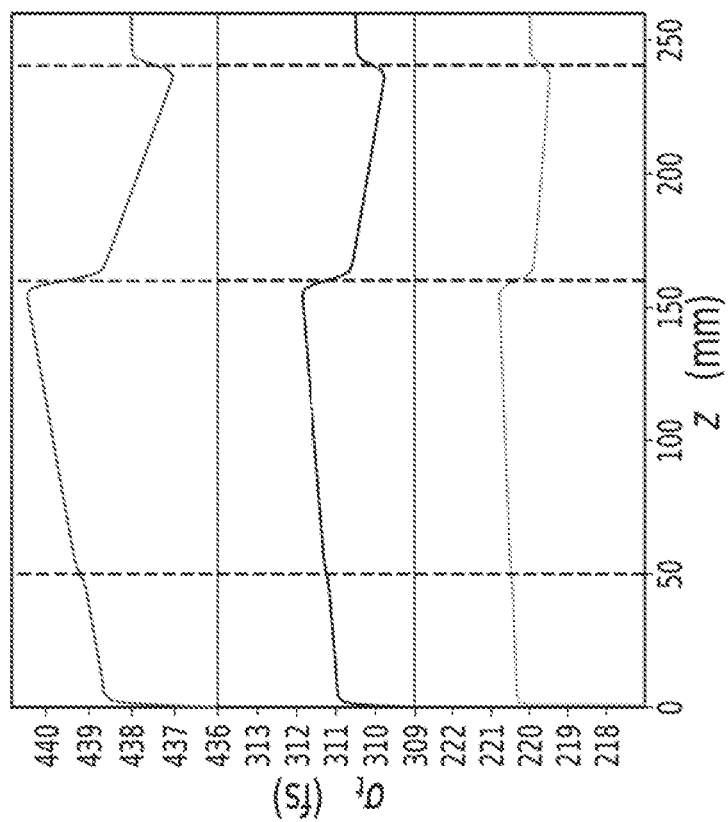
Figure 13C:
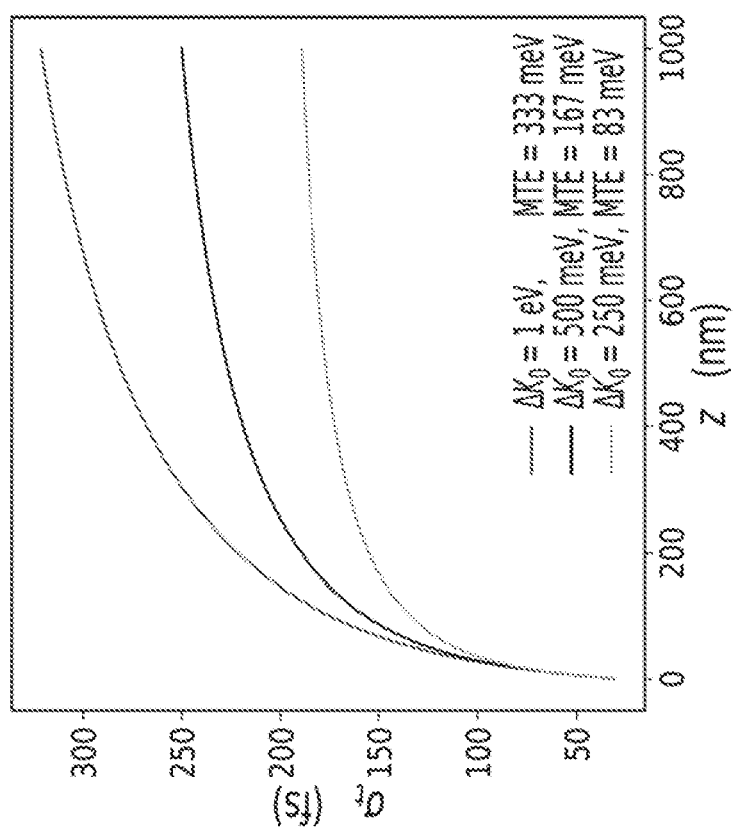

Simulation results were obtained for four sets of initial beam conditions, to elucidate the beam dynamics and indicate the practical utility of the design of monochromator device 10. The first three sets are highly idealized and designed to isolate in turn the longitudinal and transverse degrees of freedom (FIGS. 9, 10), as well as the effects of cubic and higher order non-linear cavity fields on final energy spread (FIG. 11). The fourth set corresponds to realistic photoemission beam size and momentum spread and demonstrates monochromation from 1 e V to final energy spreads on the few meV scale (FIG. 12). The cases considered do not include the effects of timing jitter, which are discussed below. Simulation beamline elements and field maps are shown in FIG. 8.

Figure 9A:
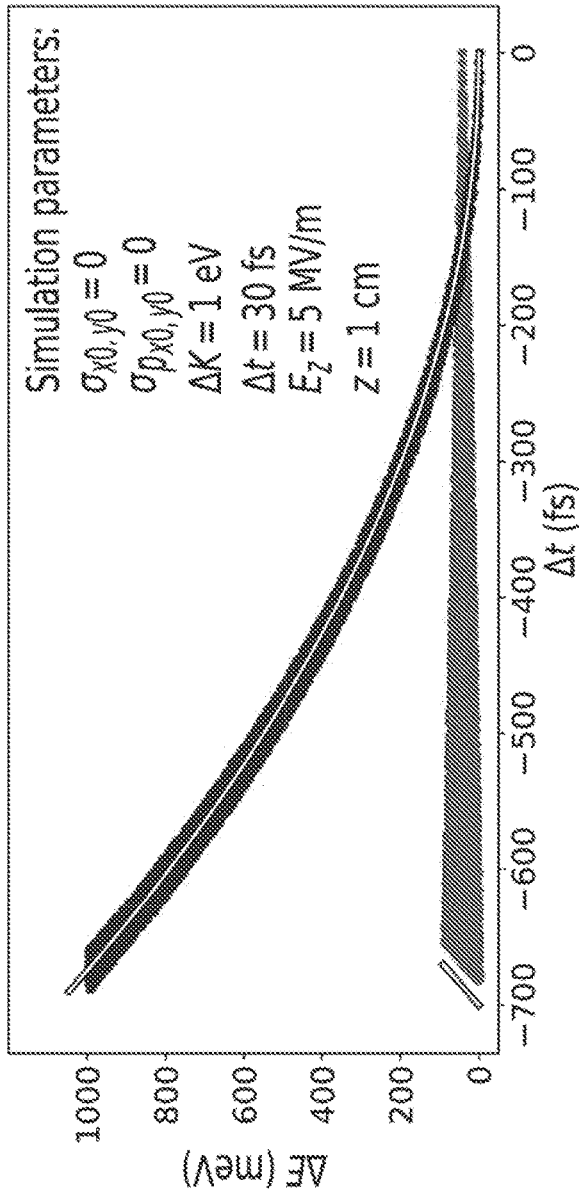
FIG. 9 is a graph of the simulation of a beam with $t_f=30$ fs and only longitudinal momemtum spread. Transverse size and momentum spread are set to zero. In (a), an idealized, uniform field gun is used. In (b), the realistic gun field shown in FIG. 5 is used. The upper curve denotes the energy-time correlation just after the gun. The lower curve shows the result after transiting a single cavity with amplitude set by the solution of solution of Equation (20). White lines are the predictions of Equation (10) and Equation (24), where in (b) the field at the cathode is used for $E_z$.
Figure 9B:
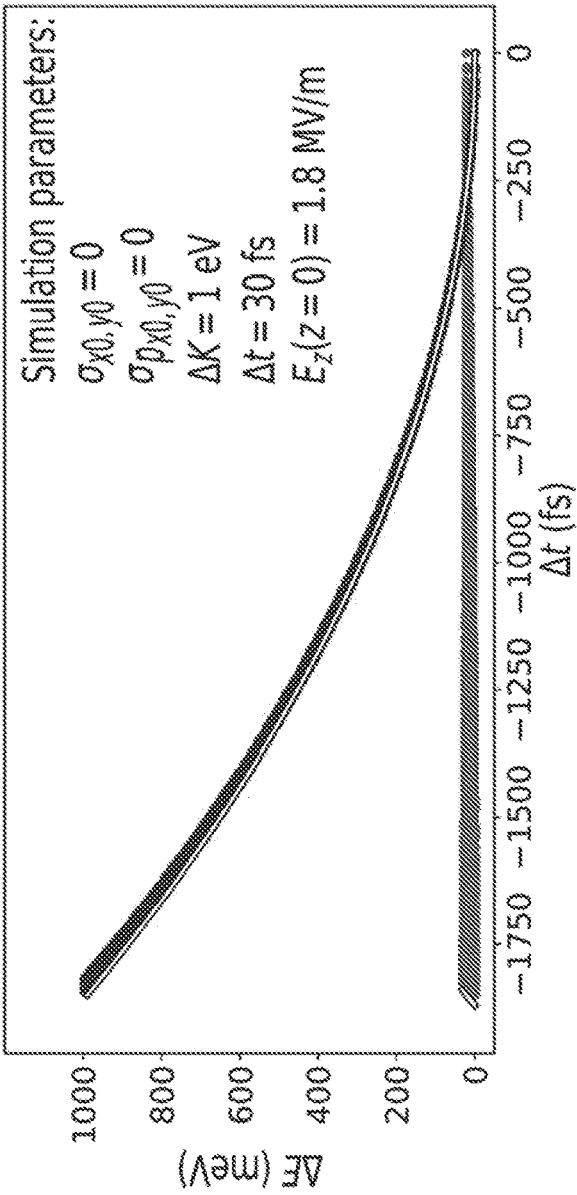

Simulating quasi-one dimensional initial beam conditions allows for easy graphical evaluation of the accuracy of Equations (20) and (21), as set forth above. The first set of initial conditions is designed to isolate the longitudinal phase space, having a source with vanishing transverse size, no transverse momentum and a laser pulse length of $\Delta t_f = 30$ fs. FIG. 9($a$) shows in the upper scatter plot of this beam in energy and time as it exits the gun. The simulated gun field map is a uniform gradient with a total accelerating voltage of 50 kV over a distance of 1 cm. The results in FIG. 9($a$) are in close agreement with Equation (10), shown in the same figure as a white curve.

FIG. 9($a$) shows in red the final distribution of the same beam in energy and time after transiting a single cavity with amplitude chosen according to Equation (20). Because the beam is quasi-one dimensional, the second cavity is unnecessary. Inspection of FIG. 9($a$) shows that the cavity removes the energy spread up to a small residual linear correlation apparent in the figure at negative arrival times. Equation (24) accurately predicts the coefficient of this linear correlation, shown in FIG. 9($a$) as a white line, confirming that the cavity restores the longitudinal emittance to its initial value.

FIG. 9($b$) shows results for the same quasi-one dimensional distribution as FIG. 9($a$) but now accelerated in the non-uniform gun field map shown in FIG. 5($b$). The field is non-uniform because of the electrode geometry, also shown in FIG. 5($b$). The accelerating voltage is 50 kV over a distance of 1 cm. The field on the cathode is 1.8 MV/m, less than half the average gradient in the gun. The prediction of Equation (10) is again shown by the white curve. In evaluating Equation (10), $E_z$ is taken to be the field on the cathode. These results show that it is indeed the photocathode field, rather than the voltage or average gradient, which sets the final pulse length and the correlation between time of arrival and energy. The lower curve shows the final energy time distribution after transiting a single cavity with amplitude chosen according to Equation (20), again identifying the accelerating gradient with the field on the cathode, $E_z \mapsto E_z$ (z=0).

The second set of initial conditions isolates the transverse direction. The beam at the source has non-zero size and transverse momentum spread but vanishing longitudinal momentum spread, so that all particles are emitted parallel to the photocathode surface. FIG. 10 shows in the upper curve the distribution of energy against radial displacement as this beam exits the gun. The prediction of Equation (10) is shown as a white curve and again agreement is close. In this case, the gun field map is a uniform accelerating gradient, which simplifies the transverse focusing in the gun. A non-uniform accelerating field results in a lens effect that spoils the agreement between the transverse distribution and Equation (10), but the qualitative picture is the same, with the energy depending quadratically on radial displacement. FIG. 10 shows in the lower curve the beam after transiting a single cavity with amplitude chosen according to Eq. (21). Again, because the beam is quasi-one-dimensional, the first cavity appearing in Equation (21) is unnecessary. The magnification factor $M_2$ is set equal to the ratio of beam sizes at the gun exit and cavity midplane. Inspection of the lower curve in FIG. 10 shows that a cavity with the analytically estimated settings over-corrects the energy-space correlation by 10%. Numerically optimizing the cavity amplitude then eliminates the over-correction as FIG. 10 shows in the bottom curve.

Next, point source initial conditions were simulated with instantaneous emission, which isolates the evolution of correlated energy-spread. The results of this simulation are presented in FIG. 11. The initial energy spread is 1 eV with momenta uniformly distributed in solid angle over the forward hemisphere. The gun (electron source) is modelled with the realistic fields shown in FIG. 8($a$). The cavity amplitude and phases are optimized numerically. Parameter values calculated from Equations (20) and (21) provide good initial guesses for the optimization algorithm and consistently overestimate the optimal cavity amplitudes, which likely arise from thick lens (non-impulsive) effects, as evidenced by inspection of individual simulated particle tracks. The sequence of transformations presented in the three panels of FIG. 11 confirms qualitatively the analytic approximation in Equation (18) for the work done by the rf cavities on the beam. Stepping through the panels, the initially paraboloid energy surface in FIG. 11($a$) is transformed after transit through the first rf cavity into a hyperboloid in FIG. 9($b$). Transit through the second rf cavity produces a surface of constant energy in FIG. 11($c$), up to cubic corrections of order $10^{-3}$ the initial energy spread, a scale consistent with the expression for the leading cubic correction in Equation (11).

Having tested the accuracy of the analytic model with idealized beam distributions, the results of simulations with realistic initial conditions are presented. Simulation parameters are shown graphically in FIG. 8. FIG. 12 shows the final energy distribution obtained from simulating an electron source of 12 nm rms transverse radius and a uniform 1 eV energy spread distributed uniformly in solid angle over the forward hemisphere. The two curves in FIG. 12 correspond to primary energies of 10 and 50 keV. The final full width at half maximum for both primary energies is 4 meV.

The evolution of energy spread as function of position down the simulated beam-line is shown in FIG. 13($b$), alongside pulse length in FIG. 13($c$) and FIG. 13($d$). Comparing FIG. 13($b$) with FIG. 13($c$) and FIG. 13($d$), the final value of the product $\sigma_E \sigma_t$ is less than the initial value, in apparent contradiction with Equation (1). The contribution the transverse momenta make to energy spread accounts for the discrepancy, with a significant fraction of the reduction in energy spread being made possible by expanding the transverse size of the beam. The ratio of final to initial transverse size is on the order of $10^3$ compared to the order 10 ratio of final to initial pulse lengths. A system of magnetostatic lenses can subsequently demagnify the beam without affecting energy spread and in the process further stretch the pulse length. For the initial conditions $\Delta K = 250$ meV shown in FIG. 13, the final product $\sigma_E \sigma_t$ exceeds $\hbar/2$ by only 30%. Even as the quantum limit is approached, summary statistics calculated from classical particle tracking continue to describe the size of the beam envelope as described in P. Baum, "Quantum dynamics of attosecond electron pulse compression," Journal of Applied Physics 122, 223105 (2017), the disclosure of which is hereby incorporated herein by reference in its entirety.

Example 2—Jitter

Jitter in the phase of the cavities relative to the photoemitting laser pulse train contributes to the final energy spread. The study in P. Pasmans, et al., "Microwave TM(010) cavities as versatile 4D electron optical elements," Ultramicroscopy 127, 19 (2013), the disclosure of which is hereby incorporated by reference herein in its entirety, finds that the scale of phase jitter is set by thermal fluctuations in the length of the cavities. The cavity fundamental frequency varies with changes in the cavity length, thereby shifting the phase difference between the driving oscillator and cavity response. In terms of a change in temperature $\Delta T$, the change in phase $\Delta \varphi$ is given by Equation (25).

$$\Delta \varphi = -2 Q K_T \Delta T, \qquad (25)$$

where Q is the unloaded quality factor of the resonator, typically $10^4$ for a normal conducting copper cavity, and $K_T$ is the coefficient of thermal expansion, $1.64 \times 10^{-5}$ K$^{-1}$ for copper. At a temperature stability of 1 mK, the uncertainty in phase is $\Delta \varphi = 3.3 \times 10^{-4}$, or 17 fs at 3 GHz. The time averaged uncorrelated energy spread introduced by phase fluctuations is given from expanding the sinusoidal time dependence of the work done by the cavities as given by Equation (26), $$\Delta E = -e d_{RF} (E_{max,1} + E_{max,2}) \left( \frac{1}{2} \Delta \phi^2 - \frac{\omega \sigma_{pz0}}{e E_z} \Delta \phi \right), \qquad (26)$$

below 10 MV/m at an initial energy spread of 1 eV or more. However, the statistical distribution peaks at late arrival times, if the particle ensemble has an initially uniform distribution in energy. For particles near this peak, the term quadratic in $\Delta \varphi$ dominates the right-hand-side of Equation (26). The takeaway from Equation (26) is thus that phase fluctuations move the tails of the energy distribution much more than they do the location of the peak, by a factor 10 to 100.

Figure 14A:
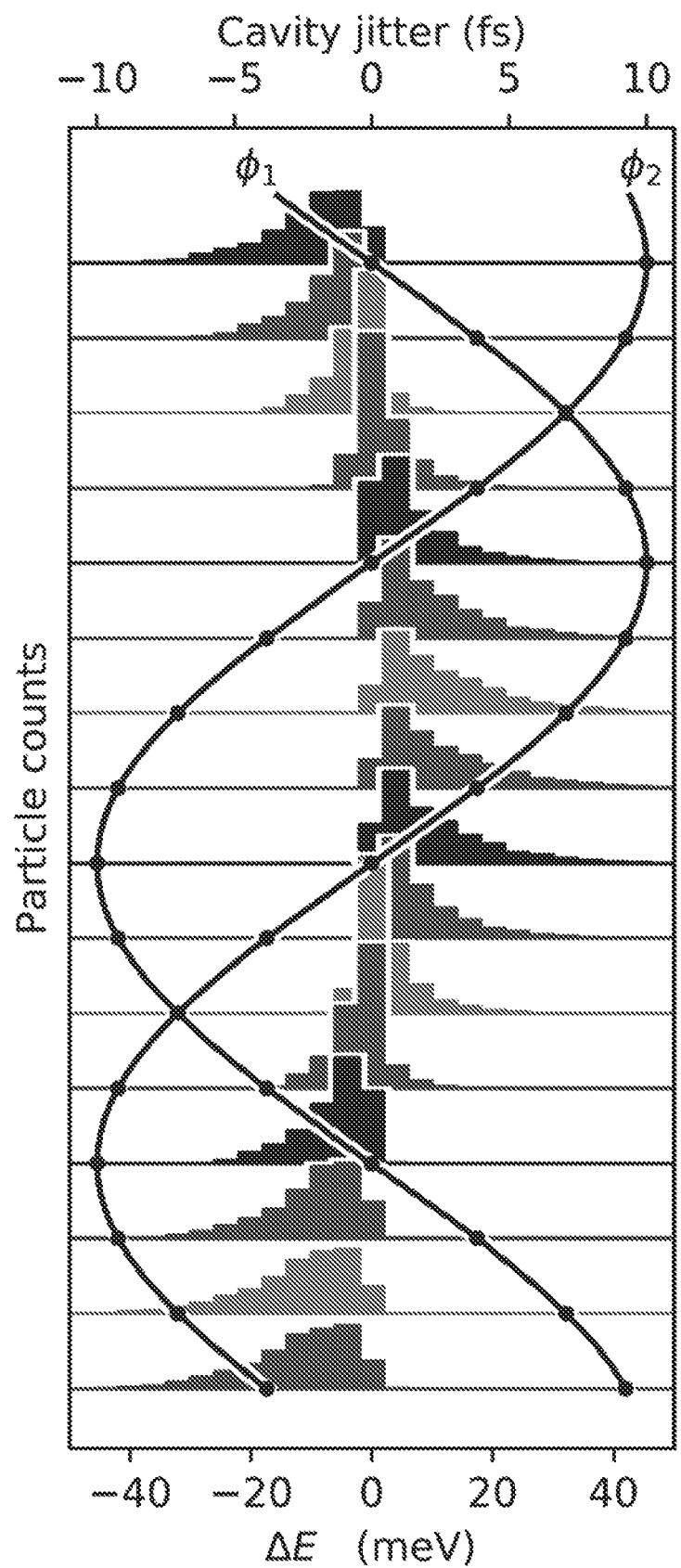
FIG. 14 are simulations of cavity timing jitter. The initial particle ensemble has a uniform 1 eV energy spread distributed uniformly in solid angle over the forward hemisphere. Plots show the ensemble after transiting two 3 GHz cavities with timing offset from the optimal solution by $\Phi 1$, $\varphi 2$ respectively. Offsets scanned add in quadrature to 10 fs. At left, histograms of final energy show single meV movement in peak location and 10 meV scale movement in tails. On the right energy-time correlation are shown as a function of cavity phase, where different phases are offset on the time axis for clarity.
Figure 14B:
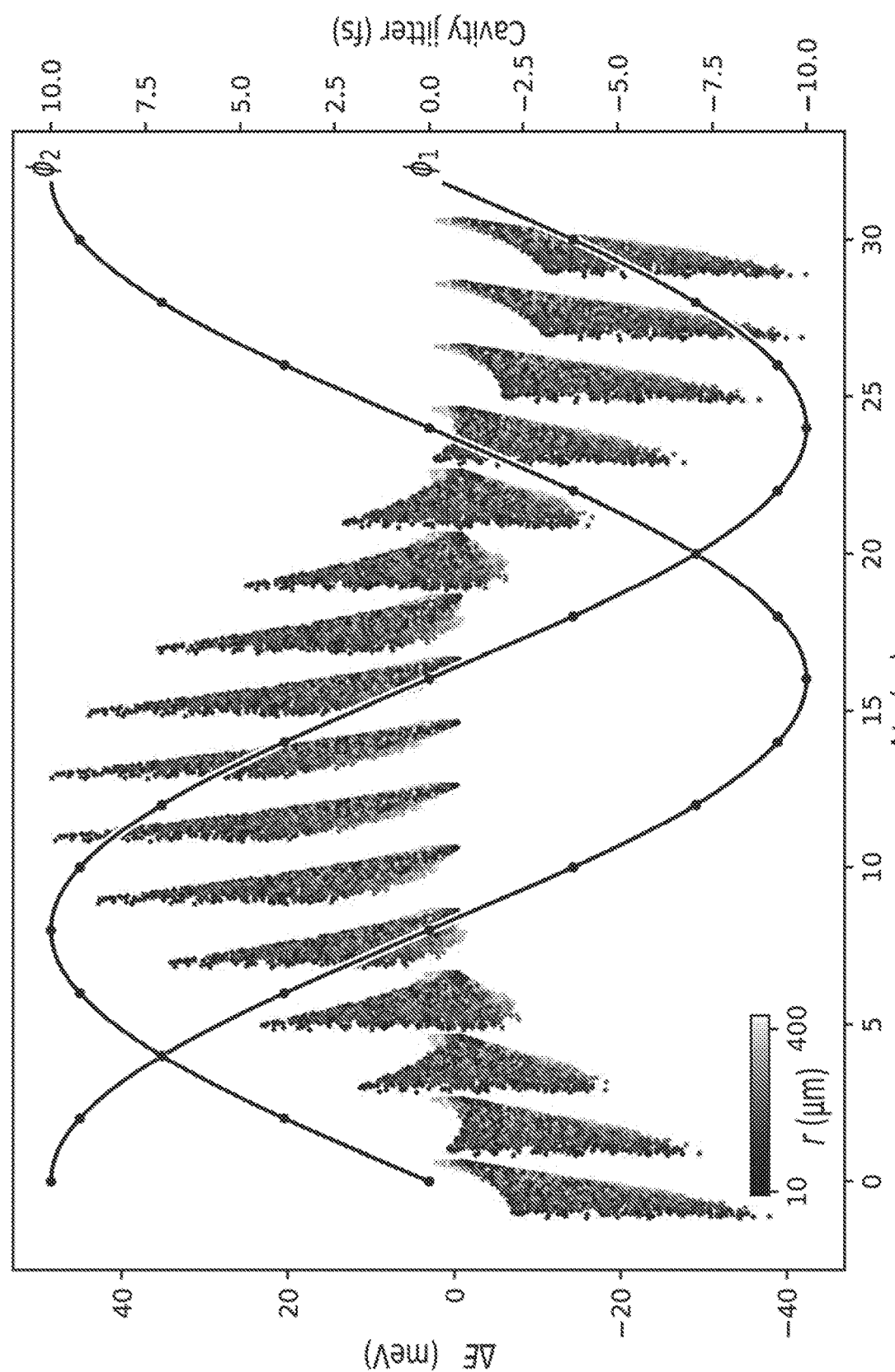

At a phase uncertainty of $\Delta \varphi = 3.3 \times 10^{-4}$, Equation (26) predicts a broadening near the peak of energy probability distribution of less than one meV and a broadening in the tails of tens of meV. The pre-factor in Equation (26) is 7 keV for the simulation example of a 50 kV gun with non-uniform gradient shown in FIG. 8, and 1 keV for the 10 KV example. These estimates are confirmed in simulation as shown in FIG. 14. The simulations cycle through a range of phase offsets $\Delta \varphi_1$, $\Delta \varphi_2$, one independent offset for each of the two rf cavities of the monochromator device. For each pair of phase offsets, the right panel of FIG. 14 shows a scatter plot in arrival time and final energy of particles in the beam. Comparison of the scatter plots supports the interpretation of Equation (26), indicating in particular that the jitter-induced movement in the tails of the final energy distribution is due to early arriving particles. The left panel of FIG. 14 shows the corresponding sequence of final energy histograms. On inspection, the jittery peak locations remain within order 1 meV the nominal peak location at $\Delta E = 0$.

Fluctuations in gun voltage are uncorrelated with time of arrival at the relevant order of precision, according to Equation (3). Energy spread due to these fluctuations is addressed by implementing the feedback loop, as described above.

Example 3—Brightness Conservation

To achieve maximum gains in average current, monochromator device 10 must omit transverse collimation. The ensemble of particles transported to the experimental target consequently includes large excursions from the optical axis, which are typically ignored in electron-microscope design. Brightness averaged over all emission angles and positions is therefore the more informative figure of merit for the unconventional beam, rather than the peak brightness more commonly encountered in a microscopy context. The preferred figure of merit is the phase space area occupied by the beam, which is inversely proportional to the square root of the brightness. The most general measure of phase space area is normalized transverse emittance, defined as:

$$\epsilon_{nx} = \frac{1}{m_e c} \sqrt{\langle x^2 \rangle \langle p_x^2 \rangle - \langle x p_x \rangle^2}. \qquad (27)$$

Minimum physically achievable emittance corresponds to a normalized emittance equal to half the reduced Compton wavelength of the electron. At the electron source, the cross term in x and $p_x$ drops out of Equation (27) and it is convenient to define a new quantity, the mean transverse energy (MTE) as given by Equation (28):

$$MTE = \frac{\langle p_x^2 \rangle}{m_e}. \qquad (28)$$

For a statistical distribution that is uniform in energy and uniformly distributed in solid angle over the forward hemisphere, the MTE is equal to ⅔ the mean energy. Letting $\sigma_{x0}$ be the rms source size, the source emittance is then given by Equation (29), $$\epsilon_{nx}(z=0) = \sigma_{x0} \sqrt{\frac{MTE}{m_e c^2}}. \qquad (29)$$

Simulation results show significant emittance degradation occurring just after emission for nanometer-sized sources with energy spreads on the 100 meV scale. Surprisingly, the action of the monochromator device largely undoes this emittance growth. The observed emittance growth can be understood as the contribution of the uniform accelerating field to the spherical and chromatic aberration of the optical column as disclosed in M. Scheinfein, et al., "Aberrations of emission cathodes: Nanometer diameter field-emission electron sources," Journal of applied physics 73, 2057 (1993), the disclosure of which is hereby incorporated herein by reference in its entirety, which amounts to a series expansion of the emittance around a vanishing solid angle. However, since the design of the monochromator device is unlike a conventional microscope, time-of-arrival dependent expressions are expressly derived for the emittance growth valid at all emission angles. These expressions then predict that, up to the accuracy of the analytical model of energy-equalization presented above, the final emittance after transiting the monochromator rf cavities is equal to the source emittance.

Simulation results reported in FIG. 13 show that, beyond the rigid-beam approximation, parameters optimized for energy spread reduction over-correct the emittance loss, imparting to the beam a correlation between time-of-arrival and divergence that is opposite in sign to the gun.

During acceleration of a pulsed beam, correlations evolve between time of arrival and beam divergence, so that projecting onto the transverse phase-space results in brightness loss. Starting from the solution to the equations of motion in x for a uniform accelerating field, the transverse emittance at proper time t is given by Equation (30), $$\epsilon_{n,x}^2 = \frac{\langle x_0^2\rangle\langle p_{x0}^2\rangle}{m_e^2 c^2} + \frac{\langle p_{x0}^2\rangle\langle p_{x0}^2 \tau^2\rangle}{m_e^4 c^2} - \frac{\langle p_{x0}^2 \tau\rangle^2}{m_e^4 c^2}. \quad (30)$$

The simplest physically plausible picture of emission from a flat cathode is that the initial momentum are uniformly distributed in solid angle over the forward hemisphere, implying a correlation between $p_{x0}$ and $p_{z0}$ and hence between $p_{x0}$ and $\tau$. These correlations are better disentangled by going over to polar coordinates as shown in Equations (31) and (32), $$p_{x0} = p_0 \sin\phi \cos\theta, \quad (31)$$

$$p_{z0} = p_0 \cos\theta, \quad (32)$$

and assuming that the momentum magnitude p is uncorrelated with the emission angles $\varphi, \Theta$. Letting the probability of emission be uniform in azimuth $\varphi$, expanding t to first order in $\Delta t$ per Equation (8) and substituting the expression for $\Delta t$ in terms of $\Delta p_{z0}$ given by Equation (5), the result is that Equation (30) becomes Equation (33), $$\epsilon_{n,x}^2 = \frac{\langle \beta_0^2\rangle}{3}\left(\langle x_0^2\rangle + \sigma_{x0*}^2\right), \quad (33)$$

with, $$\sigma_{x0*}^2 = \frac{m_e^2 c^4}{e^2 E_z^2}\left(\frac{1}{15}\langle \beta_0^4\rangle - \frac{3}{64}\frac{\langle \beta_0^3\rangle^2}{\langle \beta_0^2\rangle}\right). \quad (34)$$

where, again, $E_x$ is the longitudinal field in the gun. The term $\sigma_{x0*}^2$ is a new, critical feature of near-cathode dynamics for nanometer scale photoemission sources: an effective source size growth arising from photoemission momentum spread. The scaling of this effective source size with mean transverse energy has practical importance for active research toward higher brightness photocathodes. Assuming a uniform distribution in energy at the source, Equation (34) simplifies to Equation (35), $$\sigma_{x0*} = 0.363 \times \frac{\langle MTE\rangle}{|eE_z|}. \quad (35)$$

Thus, for nano-scale sources, photocathode emittance goes like $MTE^{3/2}$ and not the expected $MTE^{1/2}$, enhancing the potential impact of new low MTE materials on the future performance of photo-emitters. To see that the emittance growth expressed in Equation (33) can be undone by a time dependent lens, the solution to the equations of motion in x is inverted and $\tau$ is expanded to obtain an expression for particle angle dx/dz as a function of $\Delta t$, $$\frac{p_x}{p_z} = \frac{m_e(x - x_0)}{p_{z*}\tau_*} - \frac{m_e(x - x_0)}{p_{z*}\tau_*^2}\Delta t. \quad (36)$$

The term in Equation (36) proportional to $\Delta t$ is the same as the expression for the change in angle imparted by an ideal thin-lens with time-dependent focal length as given by Equation (37), $$f_{gun}^{-1} = \frac{(eE_z)^2 \Delta t}{\gamma_* \beta_* m_e^2 c^3 \mathcal{A}^2}. \quad (37)$$

Equation (37) is not meant to be an explanation of the cause of the emittance growth in the gun. Instead, Equation (37) makes the linear correlation with time of arrival explicit in a manner that serves to explain how the time-dependent focusing power of an rf cavity is able to counteract the emittance growth in the gun.

Figure 15:
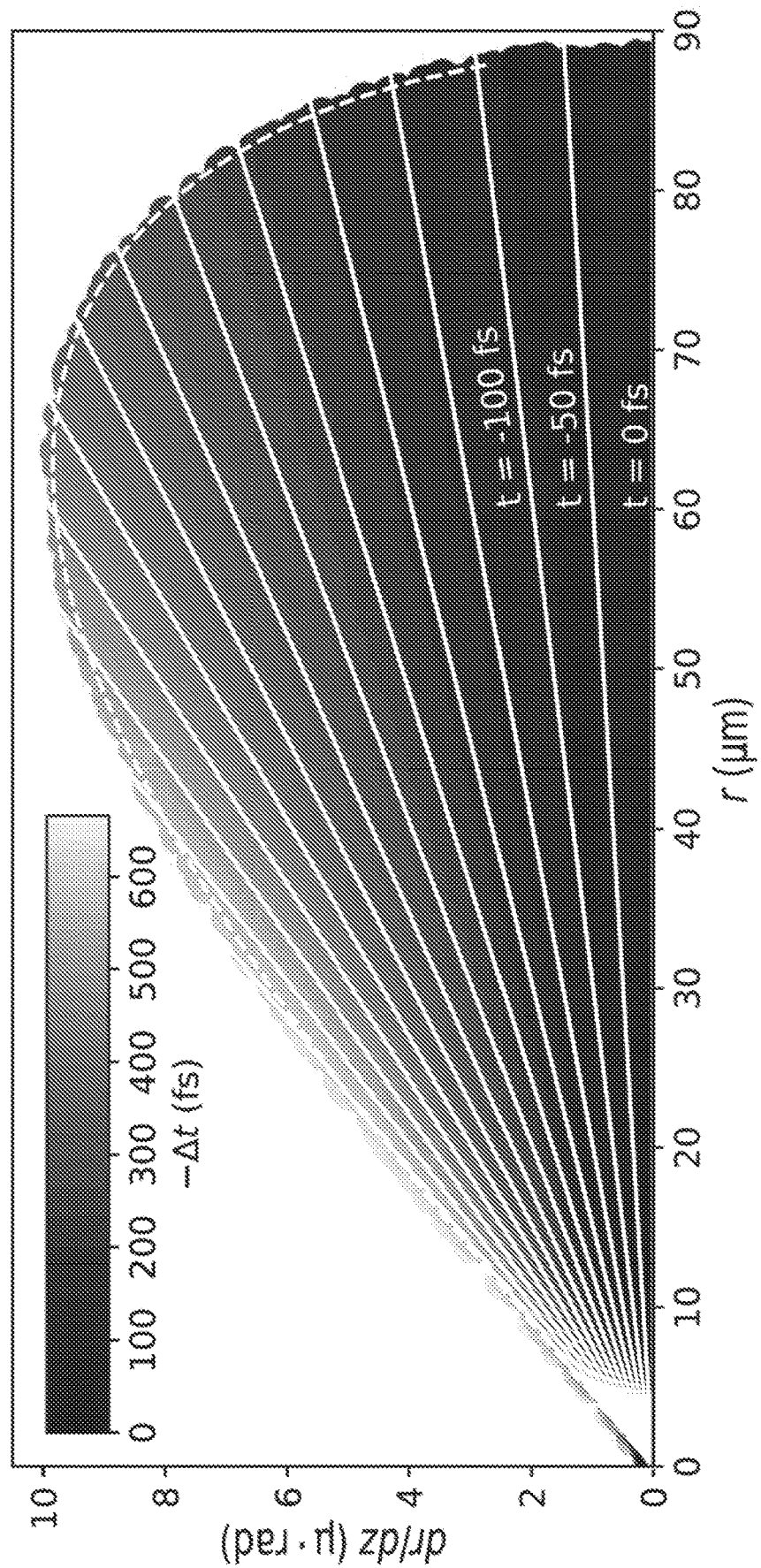
FIG. 15 is a graph showing correlations between particle divergence and time of arrival in particle tracking simulations of a uniform accelerating gradient of 5 MV/m. The initial conditions of the particle distribution are a 1 eV uniform energy spread distributed uniformly in solid angle over the forward hemisphere, and vanishing transverse size and pulse length. The time dependent divergence predicted by Equation (37) are shown by the white lines at constant time increments of 50 fs.

Simulation results verifying Equation (37) are shown in FIG. 15. To produce the plot, the beam divergence of the time-independent term in Equation (36) is subtracted. FIG. 15 overlays the divergence predicted by Equation (37) as white lines at fixed increments in time of arrival. The scale indicates the simulation time of arrival. The curved beam envelope, indicated by a dashed white line in FIG. 15 is derivable from Equation (37) by expressing divergence as a function of initial kinetic energy:

$$\frac{p_x}{p_z} = (K, x) = \frac{-eE_z x}{\gamma_* \beta_* \mathcal{A}^2}\sqrt{\frac{2K}{m_e^3 c^6} - \frac{e^2 E_z^2 x^2}{m_e^4 c^8 \mathcal{A}^2}}. \quad (38)$$

The envelope is found by holding K at a constant value equal to the maximum initial kinetic in the particle ensemble: 1 eV for FIG. 15. Comparing Equation (38) and Equation (37) clarifies an unexpected advantage of time dependent focusing fields: explicit control in the time domain makes linear an effect that appears non-linear in the transverse phase space.

The transverse focusing power of a cavity, calculated by making the same thin-lens approximation assumed in the derivation of Equation (18), is given by Equation (39), $$f_{1,2}^{-1} = \mp\frac{eE_{max,1,2}d_{RF}}{2\gamma_*^3 \beta_*^3 m_e c^3}\omega^2 \Delta t, \quad (39)$$

where the cavity phase is taken to maximize (in magnitude) the reference particle. If the gun exit is successively imaged at the midplanes of the two cavities, with magnification factors $M_1$ and $M_2$, then the condition for cancellation of the emittance growth is given by Equation (40), $$\frac{1}{f_{gun}} + \frac{M_1^2}{f_1} + \frac{M_2^2}{f_2} = 0. \quad (40)$$

Figure 8A:
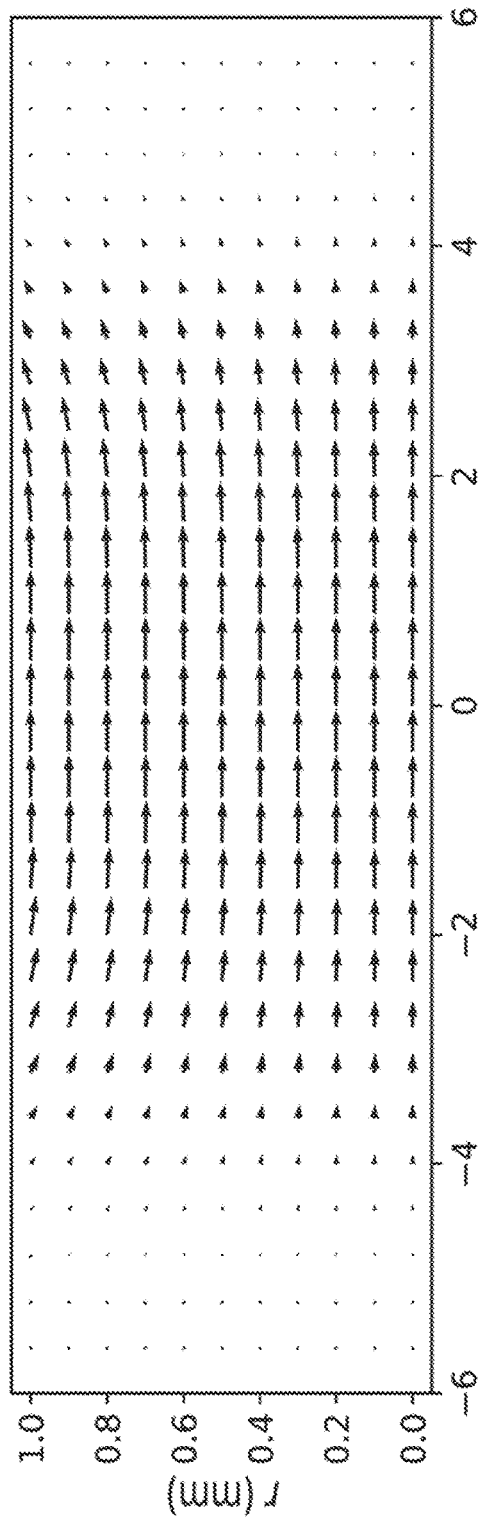
FIG. 8 is a graph of the simulation cavity field map: (a) z, r cross section of the radially symmetric cavity E field at nominal amplitude and phase; (b) the axial cavity field $E_{o,z}$ and its leading spatial derivatives, from which a simulation field map is constructed.
Figure 8B:
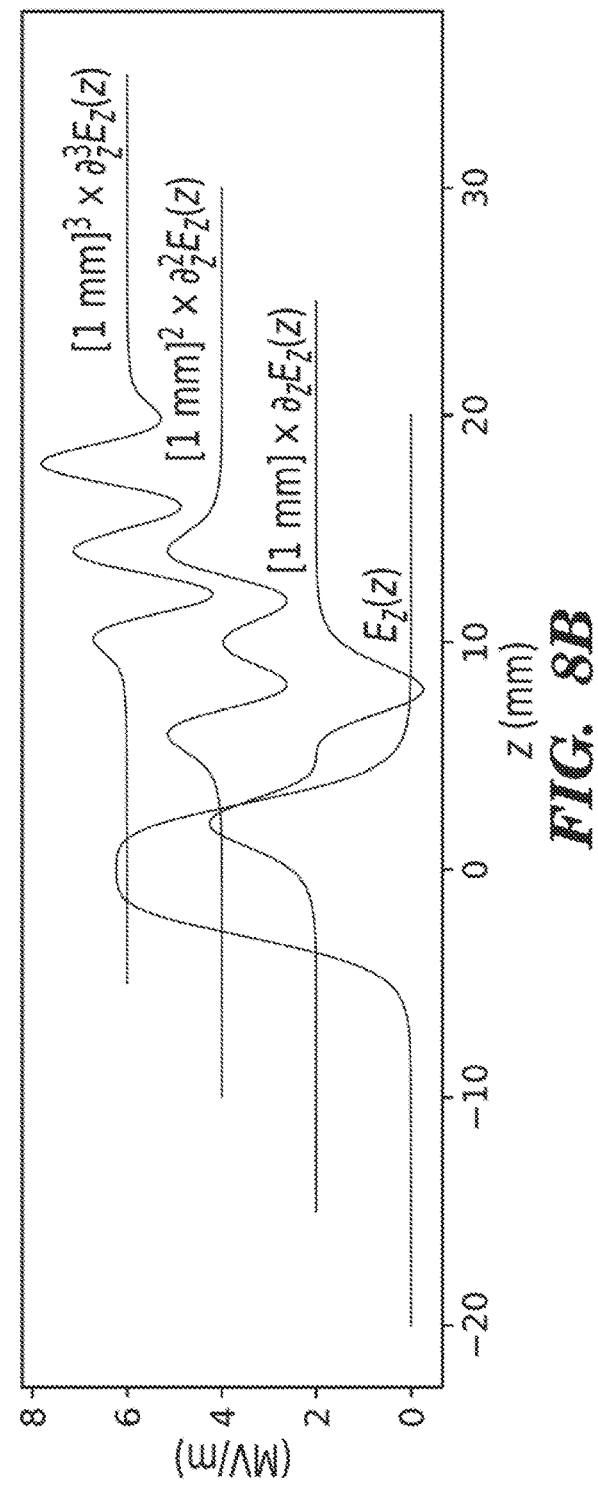

The derivation of Equation (40) assumes the pulse length remains constant after exiting the gun, a good approximation for the compact beam-line shown in FIG. 8(a). Substituting the expressions in Equations (37) and (39) into Equation (40) gives a third equation on the system of monochromator parameters $E_{max,1}$, $M_1$, $E_{max,2}$, $M_2$, $$ed_{RF}E_{max,1}M_1^2 - ed_{RF}E_{max,2}M_2^2 = \frac{(eE_z\lambda)^2}{2\pi^2}\frac{\gamma_*^2\beta_*^2}{m_ec^2\mathcal{A}^2},\qquad(41)$$

where A is again the aspect ratio defined in Equation (9). Equation (41) is equivalent to the equation obtained by setting the energy spread to zero in Equation (21).

Simulation results presented in FIG. 13 show that cavity parameters optimal for reducing energy spread actually over-correct the brightness loss in the gun. Simulated particle tracks show that this over-correction is due to particles not obeying the rigid-beam approximation made in deriving Equation (21). Thus, there is a trade-off between energy-spread-reduction and brightness conservation in a scheme involving only two rf cavities. Simulations show that, at the cost of reintroducing energy spread at the $10^{-1}$ level compared to the electron source, reducing the second rf cavity amplitude does perfectly restore the source emittance.

FIG. 13 shows simulation results for three values of the source energy spread: uniform distributions over 1 eV, 500 meV and 100 meV. The trend in energy reveals that at 250 meV and below, the excess final emittance at the minimum achievable final energy spread exceeds the source emittance by less than 30%.

Time-dependent cavity lensing undoes brightness loss in the gun. Effects apparent in simulation that go beyond the impulsive approximation result in the rf cavities over-correcting the brightness loss. Simulations show that the over-correction becomes negligible at source energy spreads of 250 meV and below, a finding that underscores the importance for future electron-beam technologies of ongoing research into photo-cathode materials with low intrinsic energy spreads.

Although preferred embodiments have been depicted and described in detail herein, it will be apparent to those skilled in the relevant art that various modifications, additions, substitutions, and the like can be made without departing from the spirit of the invention and these are therefore considered to be within the scope of the invention as defined in the claims which follow.

What is claimed is:

1. A monochromator device comprising:
   a first radiofrequency cavity positioned to receive an output beam from an electron source;
   a second radiofrequency cavity positioned to receive the output beam from the first radiofrequency cavity, wherein the first radiofrequency cavity and the second radiofrequency cavity are configured to, in combination, correct one or more energy deviations in time and space of the output beam.

2. The monochromator device of claim 1 further comprising:
   and electron source; and
   an accelerator, wherein the electron source and the accelerator are configured to provide the output beam having an energy spread correlated with time and space to the first and second radiofrequency cavities.

3. The monochromator device of claim 1, wherein the electron source is an electron gun.

4. The monochromator device of claim 2, wherein the output beam has an energy between about 3 keV to about 300 keV.

5. The monochromator device of claim 1 further comprising:
   at least one electromagnetic lens disposed along a beam path.

6. The monochromator device of claim 5, wherein the at least one electromagnetic lens comprises at least of a magnetostaic lens or a solenoid.

7. The monochromator device of claim 1, wherein the first radiofrequency cavity is configured to correct a kinetic energy spread of the output beam contained in a time degree of freedom.

8. The monochromator device of claim 7, wherein the second radiofrequency cavity is configured to correct a kinetic energy spread of the output beam in a transverse position degree of freedom.

9. The monochromator device of claim 1, wherein the first radiofrequency cavity and the second radiofrequency cavity are at least substantially identical in at least one of resonant cavity frequency or cavity length.

10. The monochromator device of claim 1, wherein the first radiofrequency cavity and the second radiofrequency cavity are not identical.

11. The monochromator device of claim 10, wherein the first radiofrequency cavity and the second radiofrequency cavity have different resonant cavity frequencies.

12. The monochromator device of claim 10, wherein the first radiofrequency cavity and the second radiofreqency cavities have different cavity lengths.

13. The monochromator device of claim 1, wherein the first radiofrequency cavity and the second radiofrequency cavity are TM010 cavities.

14. The monochromator device of claim 1 further comprising:
   a third radiofrequency cavity positioned to receive the output beam from the second radiofrequency cavity.

15. The monochromator device of claim 14, wherein a first spacing between the first radiofrequency cavity and the second radiofrequency cavity is similar to a second spacing between the second radiofrequency cavity and the third radiofrequency cavity.

16. The monochromator device of claim 14, wherein a first spacing between the first radiofrequency cavity and the second radiofrequency cavity is dissimilar to a second spacing between the second radiofrequency cavity and the third radiofrequency cavity.

17. The monochromator device of claim 14 further comprising:
   a fourth radiofrequency cavity positioned to receive the output beam from the third radiofrequency cavity.

18. The monochromator device of claim 17, further comprising:
   at least one electromagnetic lens disposed between at least one of the first radiofrequency cavity and the second radiofrequency cavity, the second radiofrequency cavity and the third radiofrequency cavity, or the third radiofrequency cavity and the fourth radiofrequency cavity.

19. The monochromator device of claim 18, wherein the at least one electromagnetic lens comprises at least one of a magnetostaic lens or a solenoid.

20. The monochromator device of claim 1 further comprising:
   an energy selector positioned optically downstream from the second radiofrequency cavity, the energy selector comprising an opening having dimensions configured to pass all particles having a nominal accelerating voltage.

21. The monochromator device of claim 20 further comprising:
   a feedback circuit operatively connected to the energy selector and to the electron source, wherein the feedback circuit is configured to adjust the output beam of the electron source responsive to data from the energy selector.

22. The monochromator device of claim 21, wherein the data from the energy selection is based on particles failing to pass through the opening and instead impacting the energy selector.

23. The monochromator device of claim 21, wherein the electron source comprises an electron gun.

24. The monochromator device of claim 23, wherein the feedback circuit is configured to adjust a voltage set-point of the electron gun.

25. An electron transmission microscope comprising the monochromator device of claim 1.

* * * * *